(12) United States Patent
Ong

(10) Patent No.: US 7,779,311 B2
(45) Date of Patent: Aug. 17, 2010

(54) TESTING AND RECOVERY IN A MULTILAYER DEVICE

(75) Inventor: Adrian E. Ong, Pleasanton, CA (US)

(73) Assignee: Rambus Inc., Los Altos, CA (US)

( * ) Notice: Subject to any disclaimer, the term of this patent is extended or adjusted under 35 U.S.C. 154(b) by 749 days.

(21) Appl. No.: 11/538,799

(22) Filed: Oct. 4, 2006

(65) Prior Publication Data

US 2007/0113126 A1 May 17, 2007

Related U.S. Application Data

(63) Continuation-in-part of application No. 11/258,484, filed on Oct. 24, 2005, now Pat. No. 7,404,117.

(51) Int. Cl.
*G11C 29/00* (2006.01)
*G01R 31/26* (2006.01)
*H01L 31/00* (2006.01)
*H01L 23/02* (2006.01)

(52) U.S. Cl. ........... 714/710; 714/711; 714/718; 324/765; 438/106; 257/686; 257/E21.526; 365/201

(58) Field of Classification Search ........... 714/710, 714/711, 718; 324/765; 438/106; 257/686, 257/E21.526; 365/201
See application file for complete search history.

(56) References Cited

U.S. PATENT DOCUMENTS

| | | | |
|---|---|---|---|
| 5,528,539 A | 6/1996 | Ong et al. | |
| 5,594,694 A | 1/1997 | Roohparvar et al. | |
| 5,666,049 A | 9/1997 | Yamada et al. | 324/158.1 |
| 5,677,884 A | 10/1997 | Zagar et al. | |
| 5,761,145 A | 6/1998 | Zagar et al. | |
| 5,794,175 A | 8/1998 | Conner | 702/119 |
| 5,825,697 A | 10/1998 | Gilliam et al. | |
| 5,838,620 A | 11/1998 | Zagar et al. | |
| 5,912,579 A | 6/1999 | Zagar et al. | |
| 5,970,008 A | 10/1999 | Zagar et al. | |
| 6,097,647 A | 8/2000 | Zagar et al. | |
| 6,104,645 A | 8/2000 | Ong et al. | |
| 6,191,603 B1 * | 2/2001 | Muradali et al. | 324/765 |

(Continued)

OTHER PUBLICATIONS

U.S. Appl. No. 60/798,113, Adrian Ong, Integrated Circuit Testing Module Including Multiplexed Inputs, filed May 4, 2006.

(Continued)

*Primary Examiner*—John J Tabone, Jr.
(74) *Attorney, Agent, or Firm*—Park, Vaughan & Fleming LLP

(57) ABSTRACT

Disclosed are systems and methods of producing electronic devices including an auxiliary circuit mounted on another, underlying, circuit at the wafer level. The auxiliary circuit is electrically connected to the underlying circuit via micro-scale interconnects. The systems are capable of testing the auxiliary circuit and/or interconnects using an interface within the underlying circuit. For example, the auxiliary circuit may be tested although it is mounted such that the interconnects are hidden, i.e., inaccessible for testing purposes after assembly using conventional testing systems and methods.

The systems and methods further allow for including excess circuits and/or excess interconnects that can be reconfigured to replace parts of the auxiliary circuit and/or micro-scale interconnects found defective during testing.

23 Claims, 10 Drawing Sheets

U.S. PATENT DOCUMENTS

| | | | |
|---|---|---|---|
| 6,208,568 B1 | 3/2001 | Zagar et al. | |
| 6,216,240 B1 | 4/2001 | Won et al. | |
| 6,253,344 B1 | 6/2001 | Fin et al. | 714/734 |
| 6,263,463 B1 | 7/2001 | Hashimoto | 714/724 |
| 6,351,681 B1 | 2/2002 | Chih et al. | |
| 6,365,421 B2 | 4/2002 | Debenham et al. | |
| 6,445,625 B1 | 9/2002 | Abedifard | |
| 6,457,141 B1 * | 9/2002 | Kim et al. | 714/30 |
| 6,492,727 B2 * | 12/2002 | Nishizawa et al. | 257/723 |
| 6,519,171 B2 | 2/2003 | Matsuzaki et al. | |
| 6,531,339 B2 | 3/2003 | King et al. | |
| 6,532,561 B1 | 3/2003 | Turnquist et al. | 714/738 |
| 6,553,529 B1 | 4/2003 | Reichert | 714/738 |
| 6,675,269 B2 | 1/2004 | Miura et al. | 711/154 |
| 6,693,449 B1 | 2/2004 | Gorgen | 324/765 |
| 6,711,042 B2 | 3/2004 | Ishikawa | |
| 6,732,304 B1 | 5/2004 | Ong | |
| 6,771,061 B2 | 8/2004 | Sartschev et al. | 324/158.1 |
| 6,812,726 B1 | 11/2004 | Ong | |
| 6,825,683 B1 | 11/2004 | Berndt et al. | |
| 6,882,171 B2 | 4/2005 | Ong | |
| 6,967,397 B2 | 11/2005 | Inoue et al. | |
| 6,996,652 B1 | 2/2006 | Ong | |
| 7,006,940 B1 | 2/2006 | Ong | |
| 7,053,470 B1 * | 5/2006 | Sellers et al. | 257/678 |
| 7,061,263 B1 | 6/2006 | Ong | |
| 7,075,175 B2 | 7/2006 | Kazi et al. | |
| 7,133,798 B1 | 11/2006 | Ong | |
| 7,139,945 B2 | 11/2006 | Ong | |
| 7,149,135 B2 | 12/2006 | Okuno | |
| 7,265,570 B2 | 9/2007 | Ong | 324/765 |
| 7,269,765 B1 | 9/2007 | Charlton et al. | |
| 7,305,595 B2 | 12/2007 | Goodwin et al. | |
| 7,402,897 B2 * | 7/2008 | Leedy | 257/678 |
| 2002/0017720 A1 | 2/2002 | Nishizawa et al. | 257/723 |
| 2003/0235929 A1 | 12/2003 | Cowles et al. | 438/17 |
| 2004/0027150 A1 | 2/2004 | Miura et al. | 324/765 |
| 2004/0100296 A1 | 5/2004 | Ong | |
| 2004/0145935 A1 | 7/2004 | Jakobs | 365/49 |
| 2004/0150089 A1 | 8/2004 | Inoue et al. | 257/685 |
| 2004/0196709 A1 | 10/2004 | Ong | |
| 2005/0023656 A1 * | 2/2005 | Leedy | 257/678 |
| 2005/0024977 A1 | 2/2005 | Ong | |
| 2005/0204223 A1 | 9/2005 | Ong | |
| 2005/0289428 A1 | 12/2005 | Ong | |
| 2006/0107186 A1 | 5/2006 | Cowell et al. | 714/776 |
| 2006/0152241 A1 | 7/2006 | Ong | |

OTHER PUBLICATIONS

U.S. Appl. No. 11/552,944, Adrian Ong, Integrated Circuit Testing Module Configured for Set-up and Hold Time Testing, filed Oct. 25, 2006.
U.S. Appl. No. 11/552,938, Adrian Ong, Integrated Circuit Testing Module Including Signal Shaping Interface, filed Oct. 25, 2006.
U.S. Appl. No. 11/480,234, Adrian Ong, Delay Lock Loop Delay Adjusting Method and Apparatus, filed Jun. 30, 2006.
U.S. Appl. No. 11/479,061, Adrian Ong, Integrated Circuit Test Array Including Test Module, Jun. 30, 2006.
U.S. Appl. No. 11/472,016, Adrian Ong, Shared memory bus architecture for system with processor and memory units, Jun. 20, 2006.
U.S. Appl. No. 11/443,872, Adrian Ong, Integrated Circuit Testing Module Including Command Driver, filed May 30, 2006.
U.S. Appl. No. 11/370,795, Adrian Ong, Integrated Circuit Testing Module Including Address Generator, filed Mar. 7, 2006.
U.S. Appl. No. 11/370,769, Adrian Ong, Integrated Circuit Testing Module Including Data Generator, filed Mar. 7, 2006.
U.S. Appl. No. 11/369,878, Adrian Ong, Integrated Circuit Testing Module Including Data Compression, filed Mar. 6, 2006.
U.S. Appl. No. 11/304,445, Adrian Ong, Integrated circuit testing module, Dec. 14, 2005.
U.S. Appl. No. 11/258,484, Adrian Ong, Component testing and recovery, Oct. 24, 2005.
U.S. Appl. No. 11/223,286, Adrian Ong, Shared bond pad for testing a memory within a packaged semiconductor device, Sep. 9, 2005.
U.S. Appl. No. 11/208,099, Adrian Ong, A Processor Memory Unit for Use in System-in-Package and System-in-Module Devices, Aug. 18, 2005.
U.S. Appl. No. 11/207,665, Adrian Ong, Electronic device having an interface supported testing mode, Aug. 18, 2005.
U.S. Appl. No. 11/207,518, Adrian Ong, Architecture and method for testing of an integrated circuit device, Aug. 19, 2005.
U.S. Appl. No. 11/108,385, Adrian Ong, Bonding Pads for Testing of a Semiconductor Device, Apr. 18, 2005.
U.S. Appl. No. 11/083,473, Adrian Ong, Internally Generating Patterns for Testing in an Integrated Circuit Device, Mar. 18, 2005.
U.S. Appl. No. 10/877,687, Adrian Ong, Multiple Power Levels for a Chip Within a Multi-Chip Semiconductor Package, Jun. 25, 2004.
U.S. Appl. No. 10/205,883, Adrian Ong, Internally generating patterns for testing in an integrated circuit device, Jul. 25, 2002.
U.S. Appl. No. 09/681,053, Kolluru, Mahadev S., Embedded memory architecture for video applications, Dec. 12, 2000.
U.S. Non-Final Office Action with mail date of Sep. 22, 2009 U.S. Appl. No. 11/552,944 filed on Oct. 25, 2006, 23 pages.

* cited by examiner

TESTING AND RECOVERY IN A MULTILAYER DEVICE

CROSS-REFERENCE TO RELATED APPLICATIONS

This application is a continuation-in-part of U.S. patent application Ser. No. 11/258,484, filed on Oct. 24, 2005, now U.S. Pat. No. 7,404,117 entitled "Component Testing and Recovery," which is related to co-pending U.S. patent application Ser. No. 11/108,385, filed on Apr. 18, 2005, entitled "Bonding pads for testing of a semiconductor device," which is a divisional of U.S. Pat. No. 6,882,171 filed on Jun. 27, 2003 and entitled "Bonding pads for testing of a semiconductor device," which is a continuation-in-part of U.S. Pat. No. 6,812,726, filed on Nov. 27, 2002, entitled "Entering test mode and accessing of a packaged semiconductor device."

This application is also related to co-pending U.S. patent application Ser. No. 10/679,673, filed on Oct. 3, 2003, entitled "Set up for a first integrated circuit chip to allow for testing of a co-packaged second integrated circuit chip," and to U.S. patent application Ser. No. 11/207,665, filed on Aug. 18, 2005, entitled "Electronic device having an interface supported testing mode." This application is also related to co-pending U.S. patent application Ser. No. 11/223,286, filed on Sep. 9, 2005, entitled "Shared Bond Pad for Testing a Memory within a Packaged Semiconductor Device." The disclosures of all of the above U.S. patents and patent applications are hereby incorporated by reference herein.

BACKGROUND

1. Field of the Invention

The invention is in the field of electronics and more specifically in the fields of integrated circuit testing and assembly.

2. Related Art

In order to meet the needs and demands of advanced applications, electronic devices are becoming increasingly complex. This complexity makes it difficult and expensive to design single integrated circuits from scratch for specific applications. One approach to meeting the needs of specific applications, while avoiding the use of complex single integrated circuits, is to assemble a set of discrete components into a single package. These discrete components may be a set of previously designed circuits assembled as a system-on-chip (SoC), for example, a system of discrete circuits on a single semiconductor die, a single system-in-package (SiP), a single system-in-module (SiM), a package-in-package (PoP), or the like.

A disadvantage of generating a single electronic device from a set of discrete components is that the failure rate of the entire device is the product of the failure rate of each of the components. Once discrete components are assembled into a single electronic device, any failure can result in the loss of the entire electronic device. Thus, if a memory component has a five percent failure rate, an electronic device having four of these memory components will have at least an 18 percent failure rate. This aggregated failure rate can be very expensive.

One approach to circuit assembly includes mounting auxiliary circuits, for example, memory, on underlying circuits at the wafer level. A built-in self test (BIST) enables testing of the resulting multi-circuit component at the wafer level. However, BIST is not capable of testing the auxiliary devices independently of the underlying circuits on which they have been mounted. Furthermore, the auxiliary circuits may not be accessible for testing. For example, they may have been mounted with contacts exposed to only underlying circuits.

There are systems for testing and repairing individual device components prior to assembly into a single system. For example, circuits can be tested at the wafer level, before the wafer on which they are produced is cut. They may also be repaired using laser fuses or anti-fuse technology. These repairs involve the use of excess (e.g., redundant) circuits within the same individual device component as replacements for defective circuits.

However, these systems cannot always detect failures related to the assembly process and when failures are detected the entire device must be discarded. There is, therefore, a need for improved systems and methods of placing auxiliary circuits, for example, memory, on underlying circuits, for example, Application Specific Integrated Circuits (ASICs), at the wafer level, testing the resulting multi-circuit components including testing the auxiliary circuits, and/or increasing the yield of the resulting multi-circuit components.

SUMMARY

Various embodiments of the invention include systems and methods for increasing the manufacturing yield of electronic devices including more than one device component. These electronic devices are typically embodied in an electronic device package and may include, for example, system-in-package (SiP), system-on-chip (SoC), system-in-module (SiM) systems, or package-in-package (PoP) systems. Manufacturing yield may be increased by identifying defects within individual device components and, through various approaches, compensating for the identified defects. For example, in some embodiments, the locations of circuits including defects are identified in a memory component, for example, a component including memory cells, and these locations are stored using fuses included in the memory component. These fuses may later be read in order to configure other device components packaged along with the memory component, such that the defects are avoided or replaced. In some embodiments, the locations of the identified circuits including defects are stored elsewhere, such as in a database.

The stored information regarding the location of defective circuits is optionally used to substitute excess (e.g., redundant) memory circuits for those memory circuits including defects. In contrast with the prior art, the excess memory circuits can be external to the memory component including the circuits being replaced. For example, the excess memory circuits may be in another device component included within the same electronic device package. Thus, in some embodiments, a memory component may be used in an electronic device, even when the memory component itself does not have sufficient excess memory circuits to replace all those that are defective.

The excess memory, or other types of excess circuitry, configured for use as a substitute, may be disposed within a variety of component device types, within the same electronic device. For example, in some embodiments, this excess memory is included in a processor, an application specific integrated circuit (ASIC), another memory circuit, an interface, or the like.

Various embodiments of the invention further include an interface included in an electronic device and configured to facilitate testing of other device components within the electronic device and/or configured for communication between various device components within the electronic device package. For example, some embodiments include an interface configured to operate in a normal mode in which the interface is used for communication between an ASIC and a memory component, or between an ASIC and an external electrical connector, and a test mode in which the interface is used for testing the memory component. Either the ASIC or the interface optionally includes the excess memory configured for replacing memory in the memory component found to be defective through the testing processes. In some embodiments, the interface is included within the memory component.

In some embodiments, the interface is configured for testing and repair of an assembled electronic device using antifuse technology. For example, in some embodiments, a shared electrical connector electronically coupled to the interface is used to access a memory component. Through the interface, the shared electrical connector may be used to access the memory component in one mode, and to access a different device component in another mode. Thus, access to the memory component after assembly of the electronic devices can be achieved without dedicated electrical connectors configured for testing of the memory component. In various embodiments, this access is used for testing and/or repair of the memory component.

While, for the purposes of illustration, some of the examples herein use memory circuits to illustrate embodiments of the invention, the examples presented are intended to apply to other types of circuits as would be apparent to one skilled in the art. These other types of circuits include, for example, signal processing circuits, analog circuits, sensors, clock circuits, processors, ASICs, logic circuits, or the like.

Various embodiments of the invention include a system comprising a first device component including a plurality of circuits, a second device component including excess circuits configurable to replace one or more of the plurality of circuits of the first device component, electronic device packaging incorporating the first device component and the second device component, and an electrical connector configured to receive programming instructions, the programming instructions being responsive to test data generated through testing of the first device component and being configured for replacing the one or more of the plurality of circuits with the excess circuits, the test data including an identity of a defective circuit within the plurality of circuits.

Various embodiments of the invention include a method comprising using a testing device to generate test results configured to identify one or more circuits including defects, the one or more circuits being disposed within a first device component, storing the test results, incorporating the first device component in an electronic device following the generation of the test results, incorporating a second device component within the electronic device, the second device component including one or more substitute circuits, and configuring the electronic device to replace the one or more circuits identified as including defects with the one or more excess circuits using the test results.

Various embodiments of the invention include a method comprising using a testing device to generate first test results data configured to identify one or more circuits including defects, the one or more circuits being disposed within a first device component and the testing occurring prior to incorporation of the first device component within an electronic device, and storing the first test results data, the first test results data being configured for replacing some of the one or more circuits including defects with excess circuits, the excess circuits being disposed within a second device component configured for incorporation within the electronic device.

Various embodiments of the invention include a system comprising means for identifying one or more circuits including defects, the one or more circuits being disposed within a first device component, means for storing information identifying the one or more circuits including defects prior to incorporation of the first device component into an electronic device, means for reading the information stored, following incorporating the first device component into the electronic device, and means for programming the electronic device in order to compensate for the defects using the information read.

Various embodiments of the invention include a system comprising an underlying circuit, an auxiliary circuit mounted on the underlying circuit, a plurality of micro-scale interconnects configured to electrically connect the underlying circuit to the auxiliary circuit, and an interface within the underlying circuit and configured for testing the auxiliary circuit and/or the plurality of interconnects.

Various embodiments of the invention include a method comprising mounting an auxiliary circuit on an underlying circuit via a plurality of micro-scale interconnects, and thereafter using an interface within the underlying circuit to generate first test results data configured to identify parts of the auxiliary circuit or parts of the plurality of interconnects as including defects.

Various embodiments of the invention include a system comprising an underlying circuit, an auxiliary circuit mounted on the underlying circuit, a plurality of micro-scale interconnects configured to electrically connect the underlying circuit to the auxiliary circuit, and an interface within the underlying circuit and configured for testing the auxiliary circuit or the plurality of micro-scale interconnects.

Various embodiments of the invention include a method comprising mounting an auxiliary circuit on an underlying circuit via a plurality of micro-scale interconnects, and thereafter using an interface within the underlying circuit to generate first test results data configured to test parts of the auxiliary circuit or parts of the plurality of micro-scale interconnects.

Various embodiments of the invention include an integrated circuit system comprising an underlying circuit, an auxiliary circuit mounted on the underlying circuit, a plurality of excess circuits included in the underlying circuit or the auxiliary circuit, and configured for replacing parts of the auxiliary circuit found to be defective through testing of the auxiliary circuit, and a plurality of micro-scale interconnects configured to electrically connect the underlying circuit to the auxiliary circuit.

Various embodiments of the invention include an integrated circuit comprising an underlying circuit, an auxiliary circuit mounted on the underlying circuit, a plurality of micro-scale interconnects configured to electrically connect the underlying circuit to the auxiliary circuit, and a plurality of excess interconnects configured for replacing parts of the plurality of micro-scale interconnects found to be defective through testing of the plurality of micro-scale interconnects.

Various embodiments of the invention include a set of integrated circuit systems produced using one or more of the method of disclosed herein and including excess interconnects or circuits. These excess interconnects or circuits are optionally designated as replacements for interconnects or circuits found to be defective. This set of integrated circuit systems may include a higher manufacturing yield relative to sets of integrated circuit systems of the prior art.

DETAILED DESCRIPTION

Figure 1:
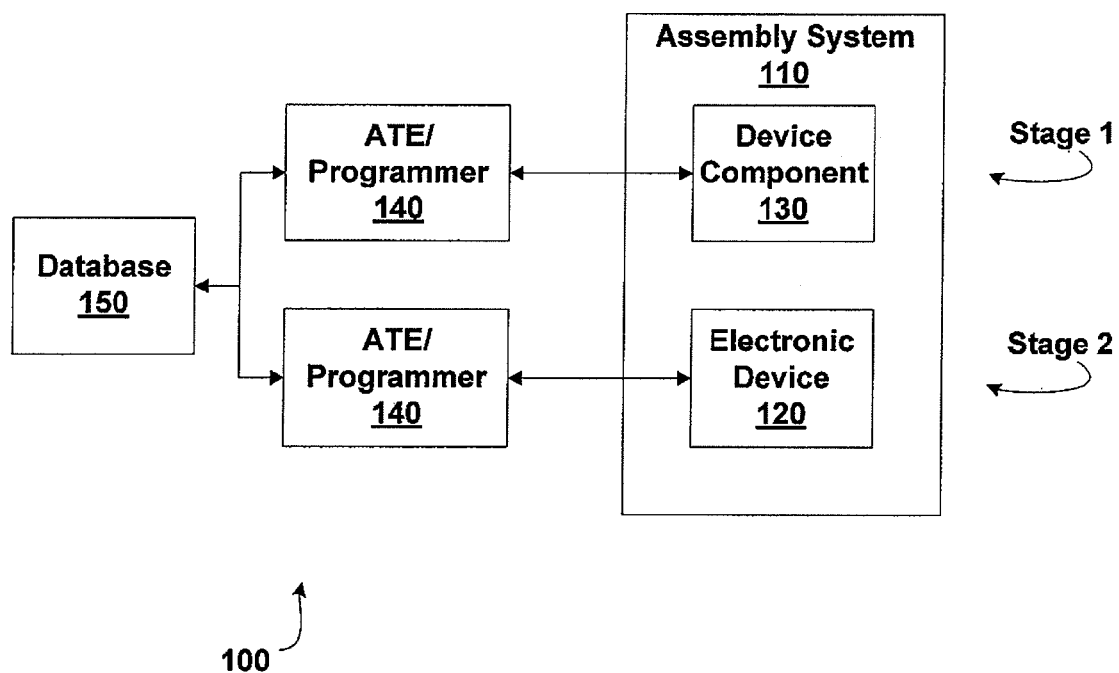
FIG. 1 illustrates an electronic device manufacturing system, according to various embodiments of the invention.

Various embodiments of the invention include systems for and methods of manufacturing an electronic device having a plurality of device components. The systems for manufacturing may include, for example, device components, assembly systems, data systems, programming equipment and test equipment. The assembly systems are configured for incorporating the device components into electronic device packaging to form the electronic device.

The assembled electronic device includes an excess (e.g., a redundancy) of one or more circuit types. For example, in some embodiments, the device components include an excess of memory circuits. As is described further herein, the excess of memory circuits are used as replacements for any memory circuits determined to be defective using the test equipment. The excess memory circuits are optionally disposed within a different device component than the defective circuits they are configurable to replace. In alternative embodiments, the excess circuits may include logic circuits, sensors, data processing circuits, timing circuits, signal processing circuits, transducers, or the like.

The assembled device components optionally further include elements configured for storing data identifying which circuits are found to be defective. For example, in some embodiments, a memory component includes fuses configured for storing data identifying defective memory circuits within that memory component. Alternative embodiments include a data system, external to the electronic device, configured for storing the data identifying which circuits are found to be defective.

The stored information is optionally used, after the device component has been incorporated in an electronic device, to reconfigure the electronic device such that the excess circuits are used to compensate for the defective circuits. In some embodiments, the use of excess circuits, as substitutes for those found to be defective, advantageously increases the yield of the manufacturing process.

Various embodiments of the invention include the manufactured electronic device wherein excess circuitry in one device component has been used to replace circuitry, of another device component, found to be defective. The electronic device can include, for example, an application specific integrated circuit (ASIC), a microprocessor, a microcontroller, a digital signal processor (DSP), a field programmable gate array (FPGA), a programmable logic device (PLD), complex programmable logic device (CPLD), a sensor, an analog-to-digital converter, an analog signal processor, a digital signal processor and/or other electronic circuits. The electronic device can further include memory, such as static random access memory (SRAM), dynamic random access memory (DRAM), synchronous DRAM (SDRAM), non-volatile random access memory (NVRAM), and read only memory (ROM), erasable programmable ROM (EPROM), electrically erasable programmable ROM (EEPROM), flash memory, or the like. In various embodiments, the excess circuitry is configurable for replacement of all or part of any of the above electronic device components.

The electronic device can include various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), or the like. These packages can utilize various leads (e.g., J-lead, gull-wing lead or BGA type connectors).

As is further described herein, testing of the various electronic device components may occur at a variety of times during the manufacturing (e.g., assembly) process. For example, in various embodiments, testing occurs at the wafer level prior to inclusion of a device component in the electronic device package, and then again after the device component is incorporated in the electronic device and the electronic device packaging is sealed such that internal components are only accessible through a limited set of electrical connectors that pass through the electronic device packaging.

FIG. 1 illustrates an Electronic Device Manufacturing System, generally designated 100, according to various embodiments of the invention. Electronic Device Manufacturing System 100 is configured to manufacture an electronic device including at least two device components, to test the manufactured electronic device, and to make use of excess circuits in one of the device components to replace circuits determined to be defective within another of the device components within the electronic device. Electronic Device Manufacturing System 100 is optionally further configured to perform tests and/or repairs of circuits determined to be defective following assembly. For example, some embodiments of Electronic Device Manufacturing System 100 include test devices configured to test a device component through a multi-mode interface and to use anti-fuses to compensate for defects found during these tests.

Electronic Device Manufacturing System 100 includes an Assembly System 110 configured for assembling an Electronic Device 120. The assembly of Electronic Device 120 typically occurs in a series of assembly stages. For the purpose of illustration, these assembly stages can be divided into a first stage (Stage 1) wherein a Device Component 130 is tested and optionally repaired, and a second stage (Stage 2) wherein the Device Component 130 is incorporated in Electronic Device 120. These assembly stages optionally occur at different times and/or in different locations. For example, Stage 1 may include manufacture of a Device Component 130 at a first location, and Stage 2 may include incorporation of the manufactured Device Component 130 in Electronic Device 120 after the Device Component 130 has been transported to a second location. Thus, Assembly System 110 may be geographically distributed. Further details of the Assembly System 110 are discussed elsewhere herein.

Electronic Device Manufacturing System 100 further includes one or more Automated Testing Equipment/Programmer, referred to herein as ATE 140, configured to test Device Component 130 at one or more assembly stages. Test data generated using ATE 140 is optionally stored in a Database 150 for use in programming Electronic Device 120 in later stages of Assembly System 110. The programming of Electronic Device 120 can include configuring Electronic Device 120 to make use of excess circuits in order to replace or otherwise compensate for circuits within Device Component 130 that are found to be defective.

Device Component 130 may include, for example, an application specific integrated circuit (ASIC), a microprocessor, a microcontroller, a digital signal processor (DSP), a field programmable gate array (FPGA), programmable logic device (PLD), complex programmable logic device (CPLD), a sensor, an analog to digital converter, an analog signal processor, other circuit types discussed herein, and/or other circuitry. Device Component 130 may further or alternatively include memory, such as, for example, static random access memory (SRAM), dynamic random access memory (DRAM), synchronous DRAM (SDRAM), non-volatile random access memory (NVRAM), and read only memory (ROM) such as erasable programmable ROM (EPROM) or electrically erasable programmable ROM (EEPROM), flash memory, or the like.

Electronic Device 120 includes one or more instances of Device Component 130, typically within an electronic device package. Electronic Device 120 may comprise, for example, system-in-package (SiP), system-on-chip (SoC), system-in-module (SiM) package-in-package (PoP) devices, or the like. The electronic device package of Electronic Device 120 can include, for example, a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), or the like. These packages may utilize various leads (e.g., J-lead, gull-wing lead or BGA type connectors, etc.). Electronic Device 120 is optionally an embodiment of Electronic Devices 10, 50 or 900 as described in U.S. patent application Ser. No. 11/207,665, filed on Aug. 18, 2005, entitled "Electronic device having an interface supported testing mode," or Circuit 90 as described in U.S. patent application Ser. No. 11/223,286, filed on Sep. 9, 2005, entitled "Shared Bond Pad for Testing a Memory within a Packaged Semiconductor Device."

Stage 1 of Assembly System 110 is configured for manufacture, and optional testing of Device Component 130. For example, Stage 1 may include a silicon foundry for manufacture of a memory circuit on a semiconductor die. An instance of ATE 140 is optionally used to test and/or repair the manufactured device component. Stage 2 of Assembly System 110 includes equipment for mounting one or more instances of Device Component 130 within an electronic device package and finishing the electronic device packaging of Electronic Device 120. The apparatus included in Stage 2 is optionally also configured to test and/or repair the one or more instances of Device Component 130 following the mounting process using an instance of ATE 140. For example, an instance of ATE 140 included in Stage 2 is optionally configured for programming, (e.g., modifying or configuring), Electronic Device 120 such that any circuits found to be defective within Electronic Device 120 are replaced by excess circuitry within Electronic Device 120. The excess circuitry used for replacement in Stage 2 may be disposed within the tested instance of Device Component 130 or within another device component within Electronic Device 120.

FIG. 1 illustrates instances Electronic Device 120 and Device Component 130. The instance of Device Component 130 shown may, at a later time be included in the instance of Electronic Device 120. Thus, these instances may be representative of the same Electronic Device 120 or ATE 140 at different times during manufacturing, and/or representative of different instances of Electronic Device 120 or ATE 140.

Figure 2:
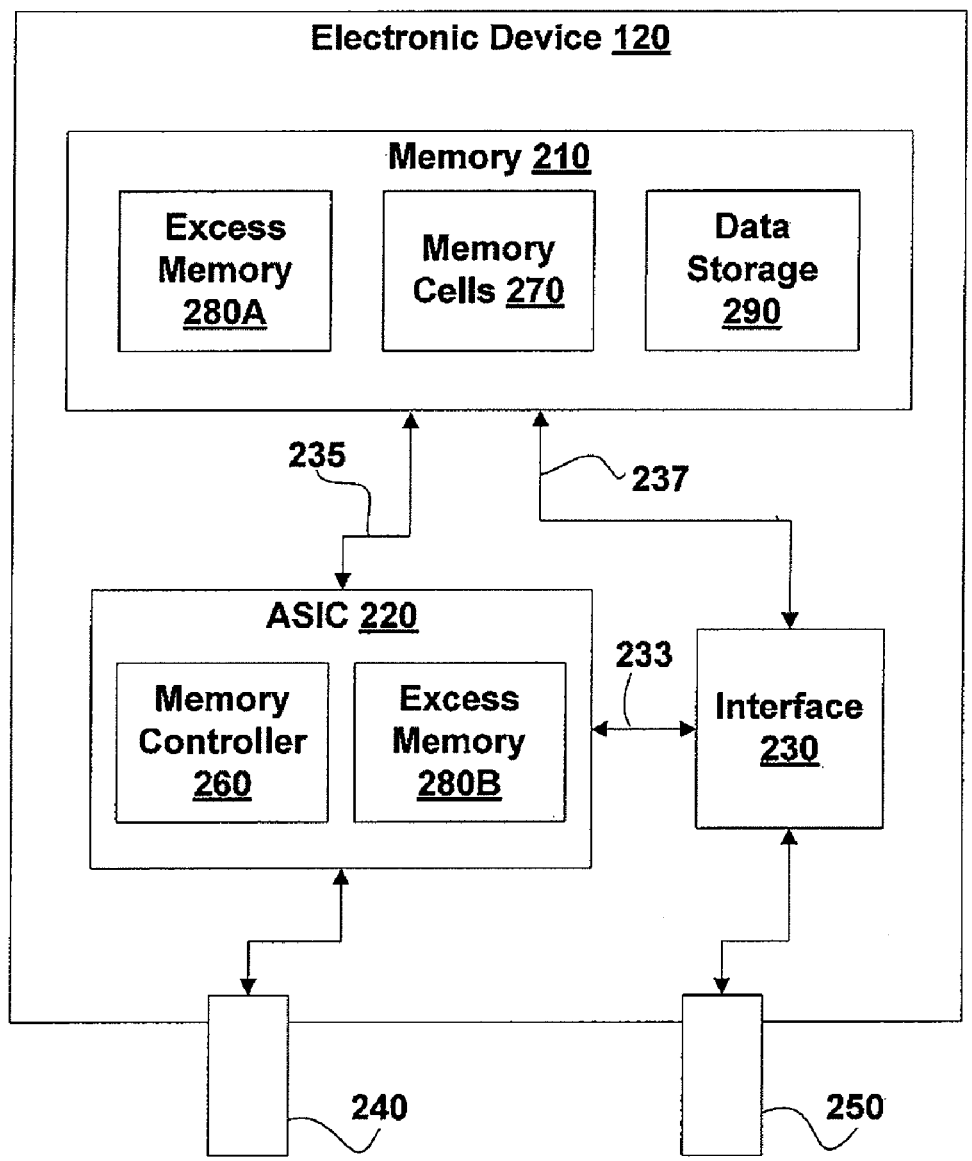
FIG. 2 illustrates an electronic device, according to various embodiments of the invention.

FIG. 2 illustrates further details of Electronic Device 120, according to various embodiments of the invention. The instances of Electronic Device 120 illustrated in FIG. 2 include Memory 210, an ASIC 220 and an Interface 230. Memory 210, ASIC 220 and Interface 230 are configured to communicate through Communication Paths 233, 235 and 237, and are each illustrative embodiments of Device Component 130. Interface 230 is optionally included in Memory 210 or ASIC 220.

At least an Electrical Connector 240 and an Electrical Connector 250 are configured for facilitating communication between Electronic Device 120 and electronics external to Electronic Device 120. Electrical Connector 240 and Electrical Connector 250 are typically pins, bond pads, or the like. Electrical Connector 240 and Electrical Connector 250 typically extend through electronic device packaging of Electronic Device 120. In some embodiments, Electrical Connector 250 is a shared electrical connector configured for communicating data to ASIC 220 in a normal operation mode and for communicating data to Memory 210 in a test mode or a programming mode. In some embodiments, Electrical Connector 250 is a shared electrical connector as discussed in U.S. patent application Ser. Nos. 11/223,286 and 11/207,665, referenced above.

Interface 230 is configured to convey signals between Memory 210, ASIC 220 and Electrical Connector 250, responsive to an operation mode, e.g., a normal operation mode, a test mode, a programming mode, or the like. For example, in some embodiments, Interface 230 is configured for communicating signals between (e.g., to and from) Electrical Connector 250 and ASIC 220 in the normal operation mode and for communicating signals between Electrical Connector 250 and Memory 210 in the test mode. In some embodiments, Interface 230 is configured for communicating signals between ASIC 220 and Memory 210 in the normal operation mode and between Electrical Connector 250 and Memory 210 in the test mode. Interface 230 is optionally configured to receive data serially in some modes and to receive part of a parallel data communication in other modes. Interface 230 may include one or more buffers, or one or more multiplexers, configured for controlling how signals are communicated in various modes.

Memory 210 includes Memory Cells 270, optional Excess Memory 280 (indicated herein as 280A and/or 280B) and optional Data Storage 290. Memory Cells 270 are configured to store digital data received from ASIC 220 or Interface 230.

Excess Memory 280 is memory configurable to replace defective memory circuits within Memory Cells 270. Data Storage 290 is configured to store information identifying the locations of defective memory circuits within Memory Cells 270. For example, in some embodiments, Data Storage 290 includes a series of fuses configured to encode the identity of locations within Memory Cells 270.

ASIC 220 optionally includes a Memory Controller 260 configurable for mapping virtual memory addresses to physical memory. For example, in some embodiments, Memory Controller 260 is initially configured to map virtual memory addresses to physical memory within Memory 210 (e.g., Memory Cells 270). ASIC 220 optionally further includes Excess Memory 280B. Excess Memory 280B includes memory cells configured to store digital data and to serve as substitutes for members of Memory Cells 270 that are found to be defective. Memory substitution using Excess Memory 280B can occur in Stage 2 of Assembly System 110 after Memory 210 is incorporated within Electronic Device 120.

Memory substitution using Excess Memory 280 may occur at various granularities. For example, in some embodiments memory substitution occurs at the minimum granularity at which memory is addressed, e.g., byte, word, or the like. In various embodiments, memory substitution occurs on a single bit basis, a row basis, a column basis, a segment basis, an array basis, a sub-array basis, a memory bank basis, or the like. In alternative embodiments, Excess Memory 280 is located elsewhere within Electronic Device 120. For example, Excess Memory 280 may be included in Interface 230 or some other Device Component 130.

Memory substitution is optionally accomplished by altering a memory map within Memory Controller 260. For example, Memory Controller 260 may include a memory map configured for converting virtual memory addresses to absolute (physical) memory addresses. Memory at a first physical location within Memory 210 may be replaced by memory at a second physical location within Excess Memory 280 or Excess Memory 280 by exchanging their respective physical memory addresses within the memory map. In some embodiments, memory substitution is accomplished by burning fuses within Data Storage 290. These fuses may be burned using laser light or electronic signals, or through other methods of fuse burning known in the art.

Programming of Electronic Device 120 responsive to tests made using ATE 140 may be accomplished according to several different approaches. In a first approach, programming is performed using ATE 140 at approximately the same time that tests are performed. In this approach, testing and programming may be part of the same operation. For example, ATE 140 may be placed in physical contact with Electronic Device 120 or Device Component 130, and before this physical contact is broken both testing and programming are performed. In a second approach, programming may be performed sometime after testing. For example, programming performed at assembly Stage 2 may be performed responsive to tests performed in Stage 1. In these embodiments, test results are optionally stored in Database 150, ATE 140 or Data Storage 290 between the testing and programming procedures. In the second approach, data from tests performed at more than one assembly stage may be aggregated and used in the same programming process. For example, tests performed using instances of ATE 140 at Stage 1 and Stage 2 may each generate results that are used for programming Electronic Device 120 in Stage 2.

In some embodiments, the information regarding defective circuits includes data identifying a memory bank, a sub-array within the memory bank, and a column sector within the sub-array. In some embodiments, the information regarding defective circuits includes data identifying a memory bank, a sub-array within the memory bank, a row sector within the sub-array, and a column sector. Alternative representations are anticipated in alternative embodiments. In some embodiments, the granularity of the circuit replacement process is selected based on the probability of failure modes, e.g., single memory cells, single or double memory rows, single or double memory columns, etc. In these embodiments, the granularity of replacement is chosen to benefit assembly yield in view of available excess memory. Examples of how the information regarding defective circuits may be stored in Data Storage 190 are presented elsewhere herein.

Interface 230 is optionally configured to convey signals from Electrical Connector 250 to Memory 210 during programming of Electronic Device 120. For example, in some embodiments, Interface 230 is configured to convey signals from Electrical Connector 250 to Memory 210 for testing purposes and also programming purposes. Those signals conveyed for testing and programming purposes are optionally conveyed to different inputs of Memory 210. Testing and programming can occur in the same mode or in separate test and programming modes. Thus, in some embodiments, Interface 230 is configured to operate in three different modes: a normal operation mode, a testing mode, and a programming mode. In the programming mode, Interface 230 is configured to convey programming signals to one or more Device Component 130 within Electronic Device 120 in order to configure the use of excess circuits as replacement circuits.

In alternative embodiments, Excess Memory 270 is included in Memory 210, ASIC 220, or another Device Component 130 within Electronic Device 120. For example, Excess Memory 270 may be included in an instance of Device Component 130 distinct from Memory 210 and ASIC 220. Likewise, in alternative embodiments, Memory Controller 260 is included in Memory 210, or some other part of Electronic Device 120.

Figure 3:
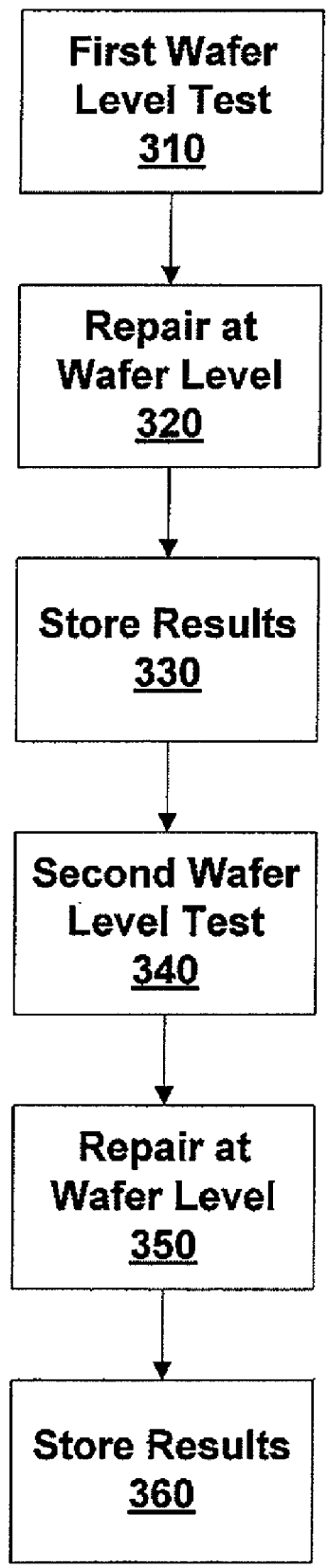
FIG. 3 illustrates methods of testing and/or repairing a circuit, according to various embodiments of the invention.

FIG. 3 illustrates methods of testing and/or repairing a Device Component 130 in Stage 1 of Assembly System 110, according to various embodiments of the invention. For example, in some embodiments, tests of Memory Cells 170 performed using ATE 140. Results from these tests are optionally used to program (e.g., reconfigure) Memory 210 such that all or part of Excess Memory 280 are used to replace defective members of Memory Cells 270. Memory 210 can be tested a second time to confirm that the replacement process was successful and/or to test Memory 210 under different conditions (e.g., at a different temperature). Test results, generated from either testing, may be used to replace defective circuits within Memory Cells 270 with all or part of Excess Memory 280. If the test results indicate that the amount of Excess Memory 280 within Memory 210 is insufficient to replace the defective circuits, Electronic Device 120 is optionally discarded or used to perform a reduced feature set for which the non-defective circuits are sufficient. Alternatively, the locations of un-replaced defective circuits within Memory Cells 270 are stored in Data Storage 290 or Database 150 for later use. In some embodiments, the steps illustrated in FIG. 3 may be performed without moving Electronic Device 120 or disconnecting ATE 140 from Electronic Device 120.

In a First Wafer Level Test Step 310, Device Component 130 is tested using ATE 140 prior to inclusion within Electronic Device 120 (e.g., in Stage 1 of Assembly System 110). The tested Device Component 130 may be rejected for incorporation within Electronic Device 120 if the number and/or types of defects discovered within Memory Cells 270 are above a certain predetermined level and excepted if the number of defects is equal to or below this predetermined level. The predetermined level is optionally greater than the capacity of Excess Memory 280 to replace defective circuits within Memory Cells 270.

In an optional Repair at Wafer Level Step 320, Memory 210 is repaired by replacing defective circuits identified in First Wafer Level Test Step 310 with all or part of Excess Memory 280. In some embodiments, these repairs are made using laser based techniques. In some embodiments, these repairs are made using anti-fuse technology. The number of defects within Memory Cells 270 that can be repaired in Repair at Wafer Level Step 320 is limited by the number of replacement circuits available within Excess Memory 280.

In a Store Results Step 330, the identities of any members of Memory Cells 270 found to be defective in First Wafer Level Test Step 310, but not replaced using Excess Memory 280 in Repair at Wafer Level Step 320, are stored. This storage may occur in Database 150 and/or Data Storage 290. In some embodiments, fuses are used to store the identities in Data Storage 290. Methods of encoding the identities of members of Memory Cells 270 using fuses are described elsewhere herein. In some embodiments, the stored information is configured to identify memory, e.g., cells, bytes, words, rows, columns, segments, banks, etc., within Memory 210 that include one or more defective memory cells.

When the identities are stored in Database 150, they are stored in association with the particular instance of Memory 210 tested such that they can be retrieved after that instance of Memory 210 is incorporated in Electronic Device 120. Database 150 is optionally configured to store test results for a plurality of Device Components 130.

In an optional Second Wafer Level Test Step 340, Memory 210 is tested using ATE 140. These tests are similar to those of First Wafer Level Test Step 310. However, Second Wafer Level Test Step 340 may be performed under different circumstances, for example at a different temperature. Further, in Second Wafer Level Test Step 340 those circuits within Memory Cells 270 previously identified as being defective need not be tested again. Following Second Wafer Level Test Step 340, if it is determined that the number of defects within Memory Cells 270 is greater than may be replaced using Excess Memory 280 and Excess Memory 280, then the tested instance of Memory 210 may be discarded or, alternatively, used to perform a reduced feature set for which the non-defective memory cells are sufficient.

In an optional Repair at Wafer Level Step 350, any members of Memory Cells 270 found to be defective in Second Wafer Level Test Step 340 are replaced using Excess Memory 280. The replacement process may be similar to that discussed above with respect to Repair at Wafer Level Step 320.

In an optional Store Results Step 360, the identities of any members of Memory Cells 270 found to be defective in Second Wafer Level Test 340 and not repaired in Repair at Wafer Level Step 350 are stored. Storage may occur in Database 150 and/or Data Storage 290. The identities stored in Store Results Step 330 and Store Results Step 360 are configured to be used to replace members of Memory Cells 270 using excess memory external to Memory 210, e.g., Excess Memory 280.

Figure 4:
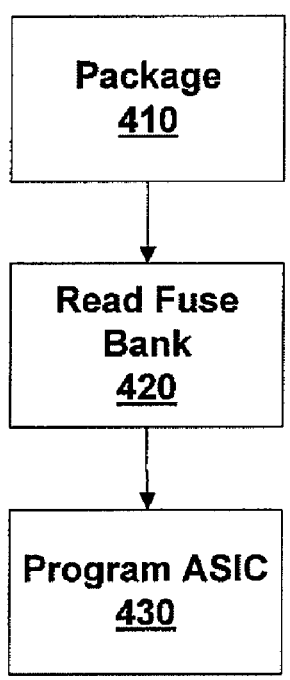
FIG. 4 illustrates methods of compensating for defective circuits in an electronic device, according to various embodiments of the invention.

FIG. 4 illustrates methods of compensating for defective circuits in Electronic Device 120 in Stage 2 of Assembly system 110. In these methods, the instance of Device Component 130 tested in the methods illustrated by FIG. 3 is incorporated within an instance of Electronic Device 120. The identities of defective circuits stored in Store Results Step 230 or 260 are read and used to reconfigure the instance of Electronic Device 120 to compensate for these defects. For example, Electronic Device 120 may be programmed to use Excess Memory 280 as a substitute for defective members of Memory Cells 270.

In a Package Step 410, Memory 210 is incorporated within Electronic Device 120. In some embodiments, incorporation includes mounting of Device Component 130 within a packaging of Electronic Device 120 and/or establishment of electrical connections between electrical connectors of Device Component 130 and electrical connectors of Electronic Device 120 (e.g., Electrical Connectors 240 or 250). Electronic Device 120 also includes further instances of Device Component 130, for example, as illustrated in FIG. 2. These further instances are optionally also incorporated within Electronic Device 120 in Package Step 410. Package Step 410 typically includes finishing (e.g., closing) of the packaging of Electronic Device 120.

In a Read Fuse Bank Step 420, the identities of any defective circuits within Memory Cells 270, that are not already replaced using Excess Memory 280, are read from Data Storage 290 or Database 150. In some embodiments, this information is read from Data Storage 290 through Interface 230 and shared Electrical Connector 250. In these embodiments, Interface 230 is placed in a read/test mode by sending an appropriate signal to Interface 230. In the read/test mode, Interface 230 is configured to convey signals from Electrical Connector 250 to Memory 210 rather than from Electrical Connector 250 to ASIC 220. Further details of switching Electronic Device 120 to read/test mode (e.g., test mode), according to some embodiments, are discussed in U.S. patent application Ser. Nos. 11/207,665 and 11/223,286. The identities are optionally read using an instance of ATE 140.

In a Program ASIC Step 430, the identities read in Read Fuse Bank Step 420 are used to program (e.g., configure) Electronic Device 120 such that Excess Memory 280 is used as replacements for circuits within Memory Cells 270 found to be defective. Programming may include configuration of Memory Controller 260, burning of fuses, or the like. In some embodiments, programming is performed using an instance of ATE 140. Instances of ATE 140 configured for reading Data Storage 290 and/or programming ASIC 220 are optionally not configured for testing Memory 210 or Electronic Device 120 or vice versa.

Figure 5:
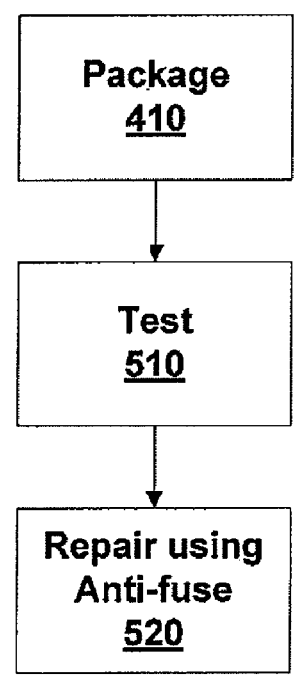
FIG. 5 illustrates methods of compensating for defective circuits in an electronic device, according to various embodiments of the invention.

FIG. 5 illustrates methods of compensating for defective circuits in an electronic device, such as Electronic Device 120, in Stage 2 of Assembly System 110. Following packaging, the electronic device is tested using ATE 140 via shared Electrical Connector 250 and Interface 230. In various embodiments, this testing may be used to confirm the success of repairs made in Repair at Wafer Level Step 350 and/or to detect defects resulting from packaging of Device Component 130 in Electronic Device 120.

Testing of Electronic Device 120 takes place in a Test Step 510. Test Step 510 typically occurs when Memory 210 is no longer directly accessible to ATE 140. In this case, testing is performed via Electrical Connector 240, Electrical Connector 250 and/or other electrical connectors disposed to convey signals between device components within Electronic Device 120 and systems external to Electronic Device 120. The testing of Memory 210 using shared Electrical Connector 250 and Interface 230, according to some embodiments, is further described in U.S. patent application Ser. No. 11/207,665, filed on Aug. 18, 2005, entitled "Electronic device having an interface supported testing mode," or Circuit 90 as described in U.S. patent application Ser. No. 11/223,286, filed on Sep. 9, 2005, entitled "Shared Bond Pad for Testing a Memory within a Packaged Semiconductor Device."

In an optional Repair Using Anti-fuse Step 520, any defects within Memory 210 identified in Test Step 510 are repaired using anti-fuse technology. These repairs are optionally made using ATE 140. As in Test Step 510, in some embodiments, communication between Memory 210 and ATE 140 is passed through Interface 230 and shared Electrical Connector 250. In these embodiments, Interface 230 is first placed in a program mode similar to the test/program mode (e.g., test mode) discussed in U.S. patent application Ser. Nos. 11/207,665 and 11/223,286. In alternative embodiments, Repair Using Anti-fuse Step 520 includes programming of Memory Controller 260 using commands sent to ASIC 220 rather than the use of anti-fuse technology within Memory 210. Repair Using Anti-Fuse Step 520 may only be possible when there is available Excess Memory 280.

Figure 6:
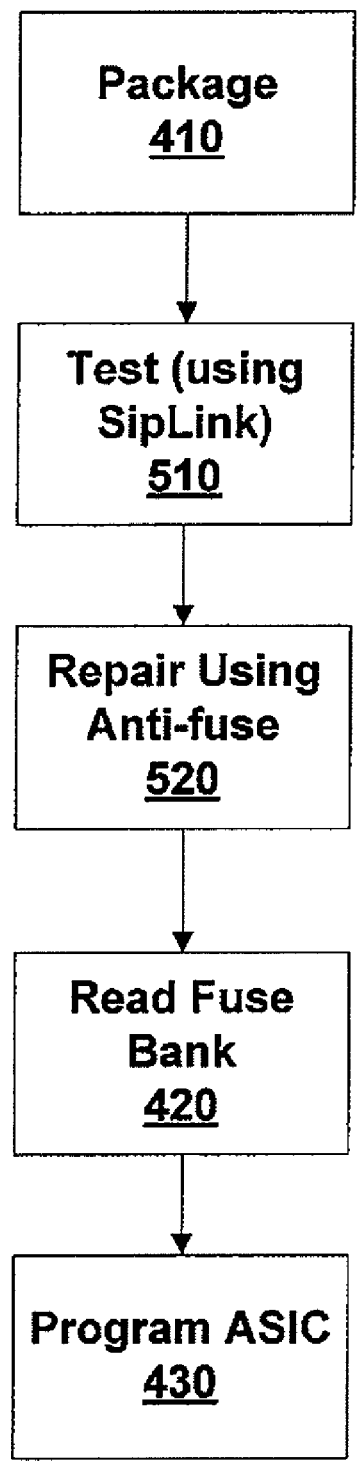
FIG. 6 illustrates combined methods of compensating for defective circuits, according to various embodiments of the invention.

FIG. 6 illustrates combined methods of compensating for defective circuits. These methods include combinations of steps illustrated in FIGS. 4 and 5. These steps may be performed in a variety of orders. For example, in contrast with FIG. 6, Steps 420 and/or 430 may be performed prior to Steps 510 and 520.

Figure 7A:
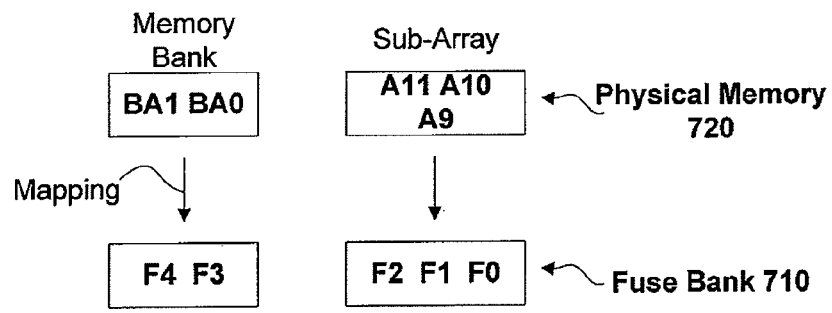
FIGS. 7A and 7B illustrate mappings of defective circuits to a fuse bank, according to various embodiments of the invention.
Figure 7B:
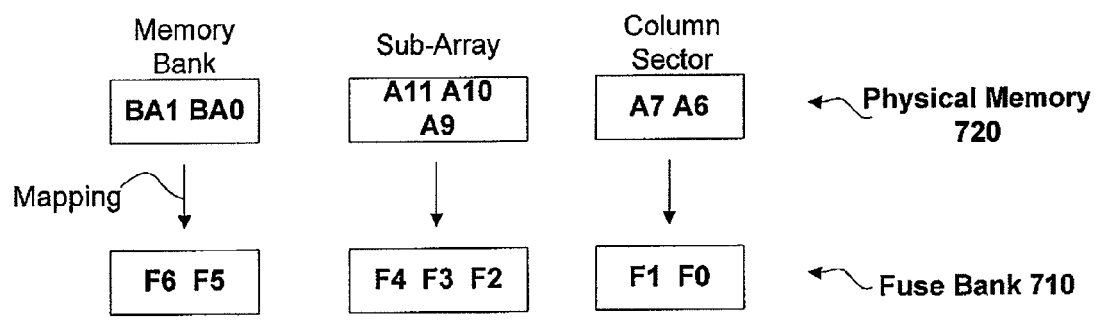

FIGS. 7A and 7B illustrate approaches to mapping defective circuits within Memory 210 to Data Storage 290, in embodiments where Data Storage 290 includes a Fuse Bank 710. FIGS. 7A and 7B differ in the granularity of the circuits identified.

In embodiments illustrated by FIG. 7A, two fuses (F4 and F3) are used to identify a specific memory bank within Physical Memory 720 of Memory Cells 270, and three fuses (F2, F1 and F0) are used to identify a specific Sub-Array within the identified memory bank. For example, in some embodiments, dynamic random access memory (DRAM) architecture is divided into multiples of sub-array segments surrounded by bit-line sense-amps and row decoders. Each sub-array segment is optionally decoded by row addresses A11, A10, and A9. Each of these row addresses, in turn, addresses 8 sub-array blocks in a bank or sub bank depending on the memory density. In these embodiments, a total of 512 rows may be included within a sub-array segment. These rows are identified using row addresses A8-A0.

The embodiment of Fuse Bank 710 shown in FIG. 7A includes five fuses F6-F0. These fuses are optionally based on DRAM laser fuse technology. To identify bank 2, sub-array 5 as a sector including defects, a laser fuse bit pattern of 10101 may be used, where a blown fuse indicates a logical "0."

FIG. 7B illustrates a mapping of Physical Memory 720 to an embodiment of Fuse Bank 710 having greater granularity than the embodiments illustrated in FIG. 7A. In the embodiments illustrated by FIG. 7B, 7 fuses are used and a partial row may be identified. This mapping is configurable, for example, to identify 64 columns (¼ of 256 columns) on a 512-row sub-array (assuming a 256-column address configuration and a 512 row per sub-array segment architecture).

Figure 8A:
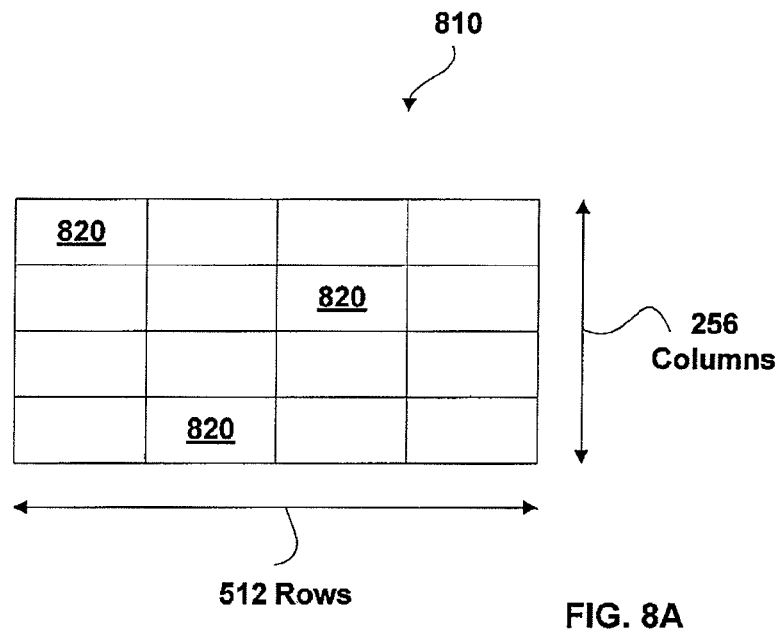
FIG. 8A illustrates a memory tiling.
Figure 8B:
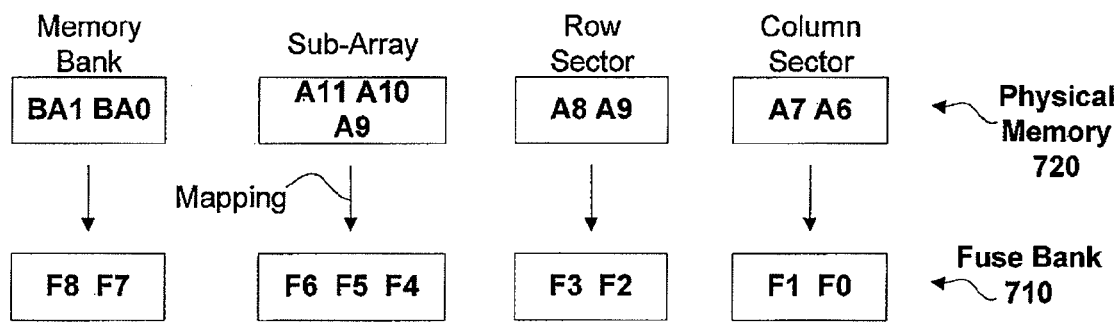
FIG. 8B illustrates mappings of defective circuits to a fuse bank, according to various alternative embodiments of the invention.

FIGS. 8A and 8B illustrate alternative embodiments of identifying members of Memory Cells 270 including defects using Fuse Bank 710 included in Data Storage 290. The illustrated approaches are based on a tile structure within a memory bank. FIG. 8A illustrates a 512-row by 256-column Sub-array Segment, generally designated 810, divided into 16 Tiles 820 each including 128 rows by 64 columns. Alternative, embodiments of Tiles 820 may include different numbers of rows and columns. For example, one embodiment includes 4 rows and 256 columns, and one embodiment includes 128 rows and 8 columns.

FIG. 8B illustrates a mapping of Physical Memory 720 to an instance of Fuse Bank 710 including 9 fuses. The number of banks in a DRAM architecture defines the number of bank sector bits (e.g., fuses required to identify a specific bank). In the illustrated example, two fuses are used to uniquely identify four banks, three fuses are used to uniquely identify a sub-array, such as Sub-Array Segment 810, and two fuses each are used to identify row sectors and column sectors.

Typically, Data Storage 290 includes an instance of Fuse Bank 710 for every defect to be replaced within Memory Cells 270. For example, in an instance of Electronic Device 120 having a capacity to replace four defects using Excess Memory 280 would include four instances of Fuse Bank 710. In various embodiments, the total number of fuses in Data Storage 290 is greater than or equal to 16, 24, 32, 40, 60 or 120 fuses. While FIGS. 7A, 7B, 8A and 8B illustrate some possible mapping schemes, it is anticipated that other mapping schemes are possible and are within the scope of the invention.

In various embodiments of the invention, Electronic Device 120 comprises a plurality of circuits mounted one atop another. For example, in some embodiments, Electronic Device 120 comprises one or more memory circuit mounted on an underlying ASIC. Various embodiments of the invention include systems and methods of manufacturing, testing and/or repairing a system comprising one or more underlying circuit onto which auxiliary circuits have been placed. The testing and/or repair can be performed on the underlying circuit (e.g., the ASIC) and/or the auxiliary circuits (e.g., the memory circuit). Furthermore, the testing and/or repair can be performed prior to and/or after placement of the auxiliary circuits on the underlying circuit. In addition, the testing and/or repair can be performed before or after the wafer, on which the underlying circuit is formed, is cut.

Figure 9:
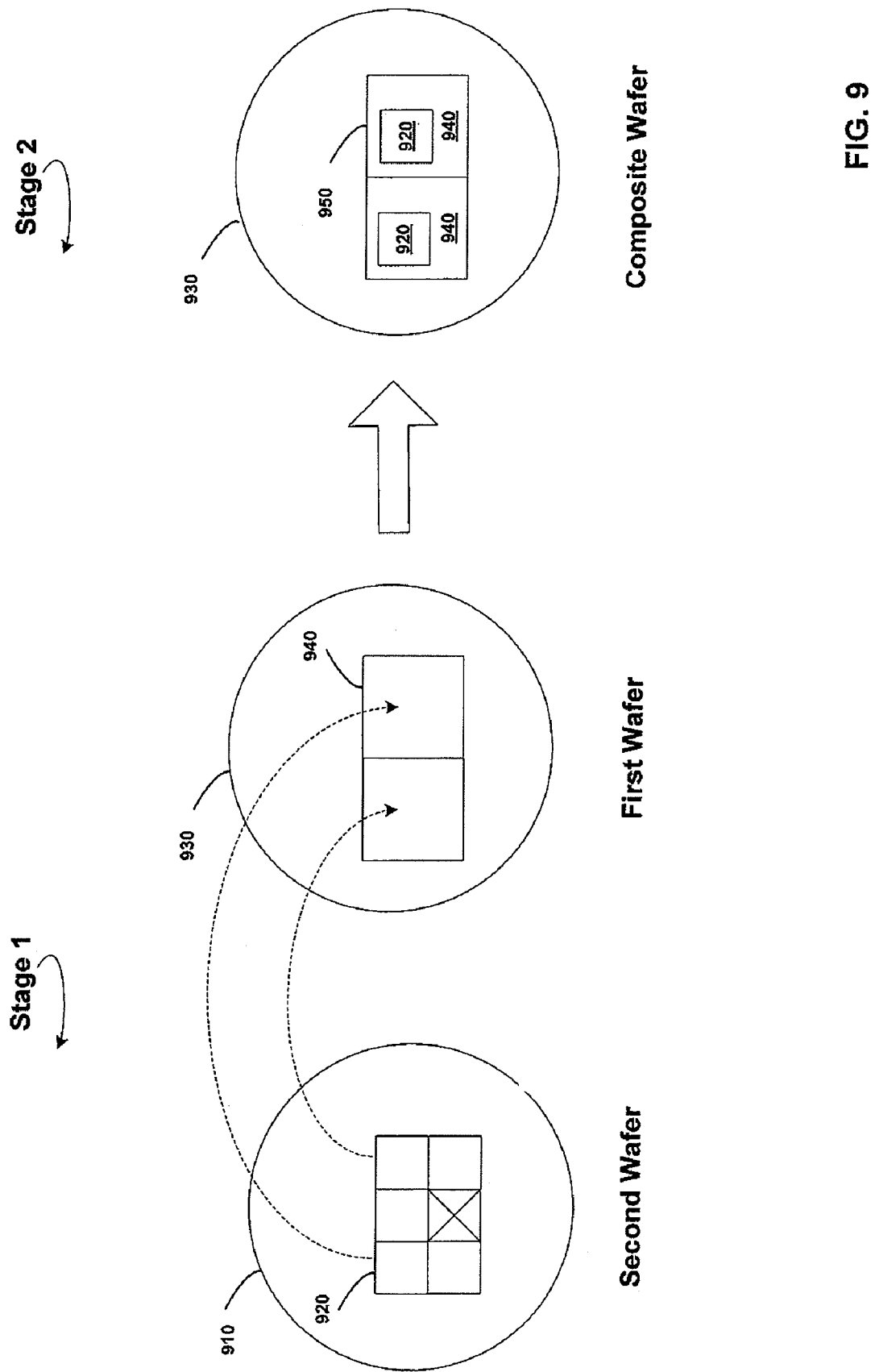
FIG. 9 illustrates the mounting of auxiliary circuits onto underlying circuits on a wafer, according to various embodiments of the invention.

FIG. 9 illustrates Underlying Circuit 940 on a First Wafer 930 on which an Auxiliary Circuit 920 from a Second Wafer 910 is mounted. The result of the mounting is a Composite Circuit 950. In embodiments illustrated by FIG. 9, Electronic Device 120 (FIG. 1) comprises Composite Circuit 950, and Device Component 130 comprises Underlying Circuit 940 and/or at least one Auxiliary Circuit 920. The mounting typically occurs after cutting of the Second Wafer 910 into at least one Auxiliary Circuit 920. The mounting can occur before or after cutting of the First Wafer 930.

In various embodiments, Auxiliary Circuit 920 and Underlying Circuit 940 are of different die sizes. Typically, the die size of Auxiliary Circuit 920 is smaller than the die size of Underlying Circuit 940. In various embodiments, Underlying Circuit 940 is an ASIC requiring high density memory and is of a larger die size than Auxiliary Circuit 920 comprising memory to be mounted (e.g., stacked) atop Underlying Circuit 940. However, in some embodiments, the die size of an ASIC may be smaller than the die size of the associated memory. In such embodiments, Underlying Circuit 940 may comprise the memory and Auxiliary Circuit 920 may comprise the ASIC. For example, the memory (whether comprising Auxiliary Circuit 920, Underlying Circuit 940, or both) can be SRAM, DRAM, or flash memory.

In some embodiments, Underlying Circuit 940 is a floating point gate array (FPGA) and Auxiliary Circuit 920 is memory. The resulting Composite Circuit 950 is a stacked-memory FPGA. Whereas FPGAs known in the art typically include large numbers of memory cells, causing the resulting FPGAs to be big, the stacked-memory FPGA Composite Circuit 950 allows for stacking parts or all memory as Auxiliary Circuit 920, thereby decreasing the overall size of the resulting stacked-memory FPGA. In alternative embodiments, Auxiliary Circuit 920 is an analog circuit and Underlying Circuit 940 a radio frequency circuit, or vice versa.

In yet other embodiments, Auxiliary Circuit 920 includes an optical device, for example, a laser emitting diode (LED), a laser diode, and/or a photon detector. Underlying Circuit 940 optionally includes a circuit manufactured from a different type of wafer than the optical device.

As discussed elsewhere herein, the assembly of Composite Circuit 950 typically occurs in a series of assembly stages. In embodiments illustrated by FIG. 9, Stage 1 of Assembly System 110, illustrated in FIG. 1, is configured for testing Underlying Circuit 940 and/or Auxiliary Circuit 920 separately. Typically, the die sizes of Auxiliary Circuit 920 and Underlying Circuit 940 are different, making alignment of Auxiliary Circuit 920 and Underlying Circuit 940 in wafer form (i.e., alignment of First Wafer 930 with Second Wafer 910) difficult. Stage 1 is therefore typically configured to test Second Wafer 920 (prior to and/or after cutting Second Wafer 920 into at least one separate Auxiliary Circuit 920) prior to mounting Auxiliary Circuit 920 on Underlying Circuit 940. Typically, Stage 1 is configured to mount only instances of Auxiliary Circuit 920 not found defective during testing on Underlying Circuit 940. In some embodiments, First Wafer 930 (prior to and/or after cutting First Wafer 930 into at least one separate Underlying Circuit 940) is tested prior to mounting Auxiliary Circuit 920 on Underlying Circuit 940. In other embodiments, Auxiliary Circuit 920 is mounted on Underlying Circuit 940 without first testing Underlying Circuit 940.

Stage 2 of Assembly System 110 is configured for testing and/or repairing Composite Circuit 950 after mounting at least one Auxiliary Circuit 920 on Underlying Circuit 940.

Auxiliary Circuit 920 may include, for example, memory circuits, such as static random access memory (SRAM), dynamic random access memory (DRAM), synchronous DRAM (SDRAM), non-volatile random access memory (NVRAM), and read only memory (ROM) such as erasable programmable ROM (EPROM) or electrically erasable programmable ROM (EEPROM), flash memory, or the like. Underlying Circuit 940 may include an application specific integrated circuit (ASIC), a microprocessor, a microcontroller, a digital signal processor (DSP), a field programmable gate array (FPGA), programmable logic device (PLD), complex programmable logic device (CPLD), a sensor, an analog to digital converter, an analog signal processor, other circuit types discussed herein, and/or other circuitry.

In embodiments illustrated by FIG. 9, Electronic Device Manufacturing System 100 (FIG. 1) is optionally configured to manufacture Composite Circuit 950 including one Underlying Circuit 940 and at least one Auxiliary Circuit 920. Electronic Device Manufacturing System 100 is further configured to test Composite Circuit 950, including testing Auxiliary Circuit 920, and/or testing Underlying Circuit 940. Electronic Device Manufacturing System 100 is optionally further configured to perform tests and/or to make use of excess circuits to replace parts of Auxiliary Circuit 920 determined to include defects within Composite Circuit 950 following the mounting of Auxiliary Circuit 920 on Underlying Circuit 940.

In the embodiment illustrated by FIG. 9, Stage 1 of Assembly System 110 is optionally further configured to mount excess circuitry on Underlying Circuit 940, for example, to mount several instances of Auxiliary Circuit 920 and/or other circuitry configurable to perform the same or a similar function as Auxiliary Circuit 920. Alternatively, Stage 1 of Assembly System 110 is configured to mount one instance of Auxiliary Circuit 920 that includes excess circuitry (e.g., excess memory cells).

Stage 2 of Assembly System 110 includes equipment for mounting one or more instances of Auxiliary Circuit 920 on Underlying Circuit 940 to generate Composite Circuit 950. The apparatus included in Stage 2 is optionally also configured to select only those instances of Auxiliary Circuit 920 determined in Stage 1 not to include defects for mounting on Underlying Circuit 940. Alternatively or additionally, the apparatus in Stage 2 is configured to select only those instances of Underlying Circuit 940 determined in Stage 1 to include less than a predetermined number of defects on which to mount Auxiliary Circuit 920. The apparatus included in Stage 2 is further optionally configured for mounting excess circuitry, such as excess data storage circuits, on Underlying Circuit 940.

The apparatus included in Stage 2 is further optionally configured for testing and/or repairing the one or more instances of Auxiliary Circuit 920 following the mounting process using an instance of ATE 140. For example, an instance of ATE 140 included in Stage 2 is optionally configured for programming (e.g., modifying or configuring) Composite Circuit 950 such that any circuits determined to be defective within Composite Circuit 950 are replaced by excess circuitry within Composite Circuit 950.

Figure 10:
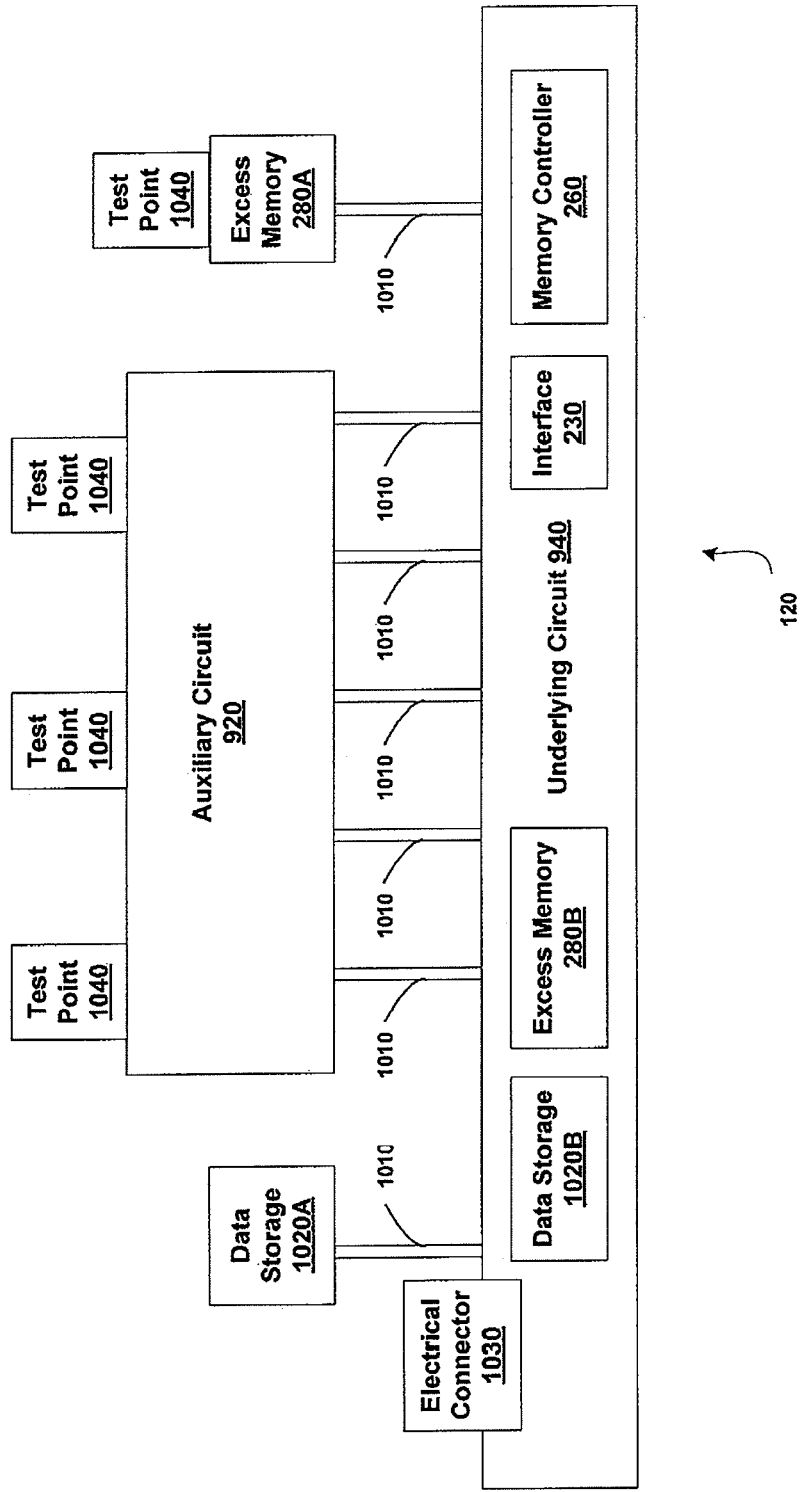
FIG. 10 illustrates further details of an electronic device comprising a composite circuit, according to various embodiments of the invention.

FIG. 10 illustrates further details of Electronic Device 120, according to various embodiments of the invention. The embodiments of Electronic Device 120 illustrated in FIG. 10 include at least one Auxiliary Circuit 920, Underlying Circuit 940, 15 Interface 230, at least one Electrical Connector 1030, and Interconnects 1010. These embodiments further optionally include Excess Memory 280A, and Data Storage 1020 (which includes Data Storage 1020A mounted on Underlying Circuit 940 and/or as Data Storage 1020B included in Underlying Circuit 940), Memory Controller 260, Excess Memory 280B, and Test Points 1040. Auxiliary Circuit 920, Excess Memory 280A, Interface 230, 20 and Data Storage 1020 are configured to communicate through Interconnects 1010.

The at least one Electrical Connector 1030 is configured for facilitating communication between Electronic Device 120 and electronics external to Electronic Device 120. Electrical Connector 1030 is typically a bond pad, or the like.

Interconnects 1010 are configured to convey signals between Electrical Connector 1030, Underlying Circuit 940, Auxiliary Circuit 920, Excess Memory 280A, and/or Data Storage 1020, responsive to an operation mode, e.g., a normal operation mode, a test mode, a programming mode, or the like. For example, in some embodiments, Interface 230 is configured for communicating signals between (e.g., to and/or from) Electrical Connector 1030 and Underlying Circuit 940 in the normal operation mode and for communicating signals between Electrical Connector 1030 and Auxiliary Circuit 920, Excess Memory 280A, and/or Data Storage 1020 in the test mode or the programming mode.

Interconnects 1010 are optionally micro-scale interconnects, vias, or the like. Micro-scale interconnects typically have geometries of less than 100 microns (i.e., millionths of a meter) in contact width. Various embodiments include micro-scale Interconnects 1010 with a pitch (i.e., a sum of the contact width of and a distance between evenly spaced interconnects) of less than approximately 50, 25, 10, 8, 5, 2, 1.0, 0.5 and 0.1 microns, respectively. For example, some embodiments may comprise Interconnects 1010 with a pitch of approximately 8 microns, the contact width being approximately 3 microns and the distance between contacts being approximately 5 microns. Some embodiments may comprise Interconnects 1010 with a pitch of approximately 8 microns, the contact width being approximately 4 microns and the distance between contacts approximately 4 microns. Some embodiments may comprise Interconnects 1010 with a pitch of 8 microns, the contact width being approximately 2 microns and the distance between contacts approximately 6 microns. The use of micro-scale interconnects allows for inclusion of large numbers of Interconnects 1010 between Underlying Circuit 940 and Auxiliary Circuit 920 and/or Excess Memory 280A.

Micro-scale interconnects can also be used to electrically connect circuit geometries, in which the connection points of Auxiliary Circuit 920 and Excess Memory 280A to Interconnects 1010 face the connection points of Underlying Circuit 940 to Interconnects 1010. For example, Auxiliary Circuit 920 may comprise memory mounted upside down on Underlying Circuit 940 being an ASIC connected using Interconnects 1010 being vias. In embodiments including such geometries, the Interconnects 1010 are hidden, i.e., are inaccessible for testing and programming purposes after assembly. By including Interface 230 in the Underlying Circuit 940, the circuits of Composite Circuit 950 can be tested and/or programmed despite the Interconnects 1010 being hidden.

The use of large numbers of Interconnects 1010 further allows for the inclusion of excess (e.g., redundant) Interconnects 1010 such that any Interconnects 1010 determined to be defective in a testing mode can be replaced in a programming mode by excess Interconnects 1010. The inclusion of excess Interconnects 1010 and the replacement of defective Interconnects 1010 with excess Interconnects 1010 applies to Interconnects 1010 connecting Auxiliary Circuit 920 as well as Excess Memory 280A to Underlying Circuit 940. In some embodiments, the inclusion of large numbers of Interconnects 1010 creates a wide data bus, resulting in fast access to Auxiliary Circuit 920 and Excess Memory 280A. The wide data bus renders the inclusion of complete address decoding and multiplexing in Composite Circuit 950 unnecessary.

In some embodiments, Auxiliary Circuit 920 comprises multiple instances of circuitry electrically connected to Underlying Circuit 940 via multiple Interconnects 1010. In some of these embodiments, the number of Interconnects 1010 is sufficiently large to render the inclusion of complete address decoding in Auxiliary Circuit 920 and/or multiplexing of signals unnecessary. Likewise, in some embodiments, Excess Memory 280A comprises multiple instances of excess circuitry electrically connected to Underlying Circuit 940 via a large number of Interconnects 1010. Optionally, the Interconnects 1010 between Auxiliary Circuit 920 and Underlying Circuit 940, and/or between Excess Memory 280A and Underlying Circuit 940, include excess Interconnects 1010 such that Interconnects 1010 determined to be defective during the testing mode can be substituted for by the excess Interconnects 1010 during the programming mode. In some embodiments, all or part of Excess Memory 280A is comprised within Auxiliary Circuit 920.

In some embodiments, Auxiliary Circuit 920 may comprise an optical device (for example, an LED, laser diode and/or optical detector) mounted on Underlying Circuit 940 (for example, an ASIC) connected using Interconnects 1010 comprising optical interface interconnects. In such embodiments, the resulting Electronic Device 120 may include an optical communications device, such as a chip-to-optical circuit or an interface to an optical data bus. For example, in various embodiments the Auxiliary Circuit 920 is connected to Underlying Circuit 940 by at least 512, 1024, or 2048 of Interconnects 1010, and is configured to communicate data received through some or all of these Interconnects 1010 to an optical communication channel. The optical communication channel may include an optical waveguide such as a fiber optic. In these embodiments, Auxiliary Circuit 920 is optionally configured to receive data in parallel through Interconnects 1010 and to relay this data to the optical communication channel in a serial fashion.

Various embodiments include optional Test Points 1040 configured for facilitating access to Auxiliary Circuit 920 for the purpose of testing and/or programming. In these embodiments, Auxiliary Circuit 920 is mounted such that the connection point of Auxiliary Circuit 920 to Interconnects 1010 faces the connection point of Underlying Circuit 940 to Interconnects 1010. These embodiments include Test Points 1040 in addition to or in lieu of Electrical Connector 1030 for facilitating communication between Composite Circuit 950 and electronics external to Composite Circuit 950 in the testing and/or programming mode. Test Points 1040 are typically contact points that can be reached by testing or programming equipment, such as ATE 140. Test Points 1040 are optionally coupled to other circuitry within Auxiliary Circuit 920 by vias through a wafer substrate. In various embodiments, Test Points 1040 are configured for programming the replacement of defective Interconnects 1010 with excess Interconnects 1010.

Excess Memory 280 is configurable to replace defective parts of Auxiliary Circuit 920. In some embodiments, Excess Memory 280 includes memory circuits configured to replace defective memory cells in Auxiliary Circuit 920. As such, Excess Memory 280 may comprise memory circuits similar to Auxiliary Circuit 920. Alternatively, Excess Memory 280 may comprise other types of circuitry capable of performing the same function as the Auxiliary Circuit 920 that the Excess Memory 280 is configured for replacing. Excess Memory 280 may be disposed within Auxiliary Circuit 920 (e.g., as Excess Memory 280A), within Underlying Circuit 940 (e.g., as Excess Memory 280B), and/or as a separate second Auxiliary Circuit 920.

Data Storage 1020 is configured for storing information identifying the locations of defective parts of Auxiliary Circuit 920 and/or defective Interconnects 1010. For example, in some embodiments, Auxiliary Circuit 920 comprises memory cells, and Data Storage 1020 stores test results from testing auxiliary memory mounted on an ASIC. For example, in embodiments in which Underlying Circuit 940 comprises an FPGA and Auxiliary Circuit 920 comprises memory, Data Storage 1020 may store data from testing of the auxiliary memory. In embodiments in which Auxiliary Circuit 920 comprises an optical device (e.g., an LED) and Interconnects 1010 comprise optical interfaces, Data Storage 1020 may store data from testing of the optical interfaces and/or the optical device. In some embodiments, Data Storage 1020 includes, for example, a series of fuses configured to encode the identity of locations within Auxiliary Circuit 920. Data Storage 1020A may optionally be included within Auxiliary Circuit 920 and/or Excess Memory 280A (not shown in FIG. 10).

Underlying Circuit 940 optionally includes a Memory Controller 260 configurable for mapping virtual memory addresses to physical memory in embodiments in which Auxiliary Circuit 920 and Excess Memory 280 include memory cells. Memory Controller 260 may make use of the information stored in Data Storage 1020 and is described elsewhere herein.

Programming of Composite Circuit 950 responsive to tests made using ATE 140 may be accomplished according to several different approaches (e.g., Program ASIC Step 430 (FIG. 4) or Repair using Anti-fuse Step 520 (FIG. 5)). In a first approach, programming is performed using ATE 140 at approximately the same time that tests are performed. In this approach, testing and programming may be part of the same operation. For example, ATE 140 may be placed in physical contact with Composite Circuit 950 via Electrical Connector 1030 and/or Test Points 1040. Before this physical contact is broken, both testing and programming are performed. In a second approach, programming may be performed some time after testing. For example, programming performed at assembly Stage 2 may be performed responsive to tests performed in Stage 1. In these embodiments, test results are optionally stored in ATE 140 or Data Storage 1020 between the testing and programming procedures. In the second approach, data from tests performed at more than one assembly stage may be aggregated and used in the same programming process. For example, tests performed using instances of ATE 140 at Stage 1 and Stage 2 may each generate results that are used for programming Composite Circuit 950 in Stage 2.

In addition, testing and/or programming may be performed while Composite Circuit 950 is in wafer form and/or after the wafer has been cut. In some embodiments, First Wafer 930 and/or Second Wafer 910 comprise multiple instances of circuitry and may be split into multiple, separate circuits prior to testing and/or programming.

In the context of FIG. 10, Interface 230 is included within Underlying Circuit 940. Interface 230 is optionally configured to convey signals from Electrical Connector 1030 to Auxiliary Circuit 920 during programming of Composite Circuit 950. For example, in some embodiments, Interface 230 is configured to convey signals from Electrical Connector 1030 to Auxiliary Circuit 920 for testing purposes and also for programming purposes. Testing and programming can occur in the same mode or in separate test and programming modes. Thus, in some embodiments, Interface 230 is configured to operate in three different modes: a normal operation mode, a testing mode, and a programming mode. In the programming mode, Interface 230 is configured to convey programming signals to Excess Memory 280 within Composite Circuit 950 in order to configure the use of excess circuits as replacement circuits.

Figure 11:
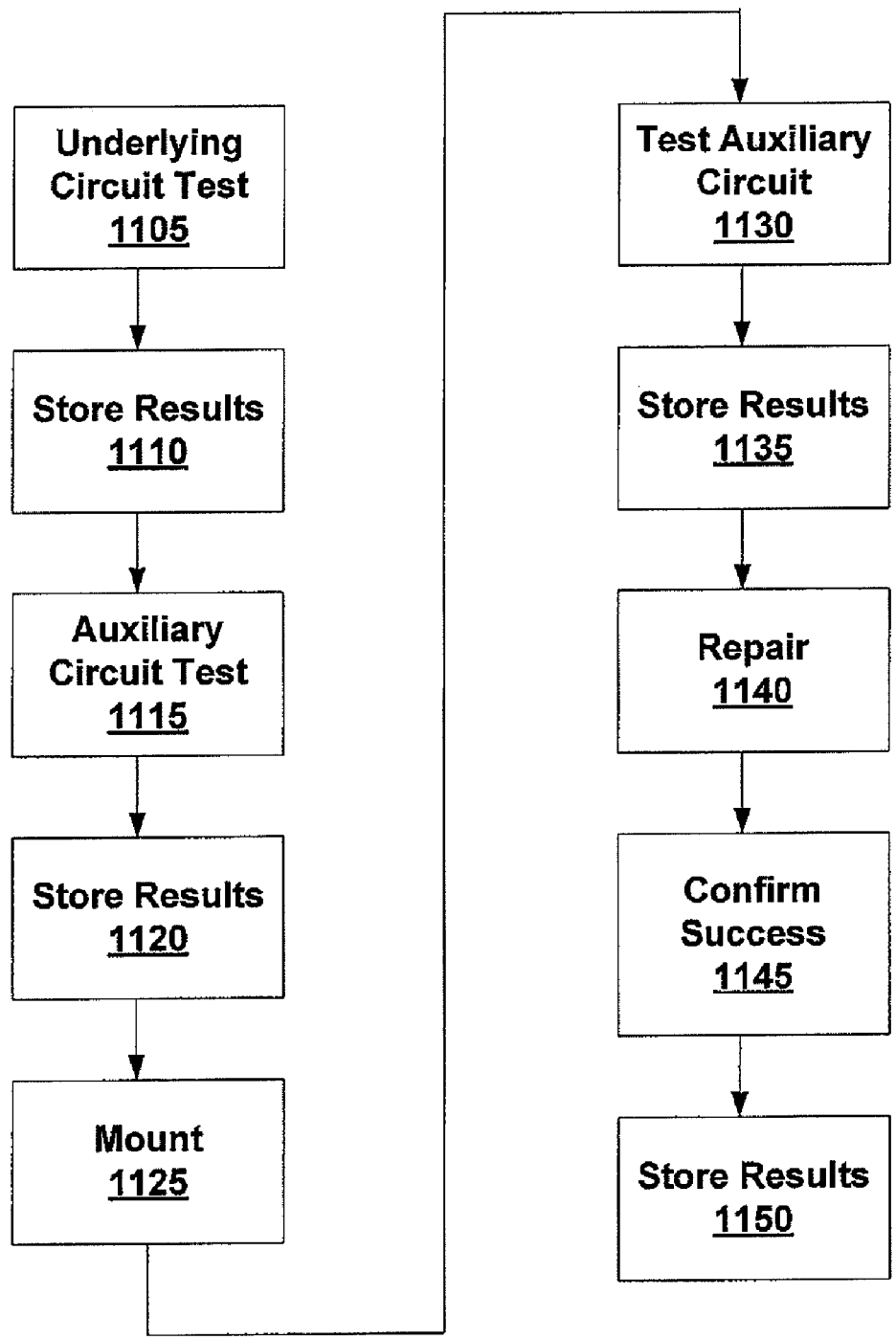
FIG. 11 illustrates methods of compensating for defective circuits within a composite circuit, according to various embodiments of the invention.

FIG. 11 illustrates methods of testing and/or repairing circuits on Composite Circuit 950 in Stage 1 and Stage 2 of Assembly System 110, according to various embodiments of the invention. A similar method may be used for replacing Interconnects 1010. Results from these tests are optionally used to program (e.g., reconfigure) Excess Memory 280 such that some or all of Excess Memory 280 is used to replace defective parts of Auxiliary Circuit 920. Auxiliary Circuit 920 and/or reconfigured Excess Memory 280 can be tested anew to confirm that the replacement process was successful. In addition, Auxiliary Circuit 920 and/or reconfigured Excess Memory 280 can be tested under different conditions (e.g., at a different temperature). If the test results indicate that Excess Memory 280 comprises insufficient circuitry to replace the defective circuits, Composite Circuit 950 is optionally discarded. Alternatively to discarding Composite Circuit 950, Composite Circuit 950 may be used to perform a reduced feature set for which the non-defective circuits are sufficient. Alternatively, the locations of un-replaced defective circuits are stored in Data Storage 1020 for later use. In some embodiments, the steps illustrated in FIG. 11 may be performed without moving Electronic Device 120 or disconnecting ATE 140 from Composite Circuit 950.

In an Underlying Circuit Test Step 1105, one or more instances of Underlying Circuit 940 is tested using ATE 140 prior to mounting of Auxiliary Circuit 920 on Underlying Circuit 940 (e.g., during Stage 1 of Assembly System 110).

In a Store Results Step 1110, the identities of any parts of Underlying Circuit 940 determined to include defects in Underlying Circuit Test Step 1105 are stored. This storage may occur in Data Storage 1020A and/or in Data Storage 1020B. The identities of defects are stored in Data Storage 1020 in association with the particular Underlying Circuit 940 such that the identities can be retrieved after that particular Underlying Circuit 940 is incorporated in Composite Circuit 950. In alternative embodiments, the identities of defects are stored in ATE 140. In some embodiments, the identities of defects are stored in part in Data Storage 1020 and in part in ATE 140.

In some embodiments, Underlying Circuit Test Step 1105 and Store Results Step 1110 are optional. In such embodiments, Underlying Circuit 940 is not tested for defects prior to assembly.

In an Auxiliary Circuit Test Step 1115, Auxiliary Circuit 920 is tested using ATE 140 prior to mounting Auxiliary Circuit 920 on Underlying Circuit 940. These tests are similar to those of Underlying Circuit Test Step 1105.

A tested Auxiliary Circuit 920 may be rejected for incorporation into Composite Circuit 950 if the number and/or types of defects discovered are above a certain predetermined level and excepted if the number of defects is equal to or below this predetermined level. The predetermined level is optionally less than or equal to the capacity of Excess Memory 280 to replace defective parts of Auxiliary Circuit 920.

In a Store Results Step 1120, the identity of any Auxiliary Circuit 920 determined to be defective in Auxiliary Circuit Test Step 1115 is stored. This storage may occur in Data Storage 1020A, Data Storage 1020B, and/or ATE 140.

In a Mount Step 1125, only instances of Auxiliary Circuit 920 determined not to include defects in Auxiliary Circuit Test Step 1115 are selected for mounting on Underlying Circuit 940. In some embodiments, only instances of Underlying Circuit 940 determined not to include defects in Underlying Circuit Test Step 1105 are selected on which to mount Auxiliary Circuit 920. In other embodiments, Auxiliary Circuit 920 is mounted on Underlying Circuit 940 regardless of whether Underlying Circuit Test Step 1105 was performed and, if it was, regardless of whether or not Underlying Circuit 940 was determined to include defects.

Auxiliary Circuit 920, mounted in Mount Step 1125, optionally comprises Excess Memory 280A and/or Data Storage 1020A.

In a Test Auxiliary Circuit Step 1130, Auxiliary Circuit 920, mounted in Mount Step 1125, is tested using Interface 230. In some embodiments, Test Auxiliary Circuit Step 1130 may be performed under circumstances different from those in Auxiliary Circuit Test Step 1115, for example at a different temperature. Following Test Auxiliary Circuit Step 1130, if a determination is made that the number of defects is greater than that which may be replaced using Excess Memory 280 (or, optionally, greater than Excess Memory 280 determined not to include defects in Test Auxiliary Circuit Step 1130), then the tested Composite Circuit 950 may be discarded or, alternatively, used to perform a reduced feature set for which the non-defective circuits are sufficient.

In various embodiments, if a determination is made that the number of defects is greater than that which may be replaced using Excess Memory 280, Test Auxiliary Circuit Step 1130 comprises adding further Excess Memory 280, for example as another Auxiliary Circuit 920. These embodiments further comprise optionally repeating Test Auxiliary Circuit Step 1130 to test the added further Excess Memory 280. The step of adding further Excess Memory 280 may optionally be repeated iteratively. In some embodiments, the iterative repeating continues until a determination is made that sufficient Excess Memory 280 has been added to replace the number of defects found in Auxiliary Circuit 920. In various embodiments, the iterative repeating continues up to a predetermined number of times, at which point the tested Composite Circuit 950 may be discarded if the number of defects is greater than that which may be replaced using Excess Memory 280 present in the Composite Circuit 950 after the final iteration. Alternatively, the tested Composite Circuit 950 may be used to perform a reduced feature set for which the number of defects is lower than that which may be replaced using Excess Memory 280.

In Test Auxiliary Circuit Step 1130, Interface 230 is placed in read/test mode by sending an appropriate signal to Interface 230, e.g., from ATE 140 via Electrical Connector 1030 or via Test Points 1040. In the read/test mode, Interface 230 is configured to convey signals from Electrical Connector 1030 and/or Test Points 1040 to Auxiliary Circuit 920 and/or Excess Memory 280 via Interconnects 1010. Conveying the signals through the Interconnects 1010 allows for testing Auxiliary Circuit 920 and/or Excess Memory 280 using shared bond pads. Furthermore, Interconnects 1010 allow for connecting to Auxiliary Circuit 920 and/or Excess Memory 280A regardless of whether they have been mounted with the connecting point to Interconnects 1010 facing Underlying Circuit 940. For example, memory cells placed upside down on Underlying Circuit 940 may be tested using Interconnects 1010 in the form of micro-scale interconnects. Switching of Composite Circuit 950 to read/test mode is discussed elsewhere herein. In some embodiments, the identities of any defective circuits are read by Interface 230 from Data Storage 1020A via Interconnects 1010 and/or from Data Storage 1020B. In other embodiments, the identities of any defective circuits are read via Electrical Connector 1030 from an instance of ATE 140.

In some embodiments, Auxiliary Circuit 920 comprises Excess Memory 280 and/or Data Storage 1020A, which may also be tested in Test Auxiliary Circuit Step 1130.

In some embodiments, Interconnects 1010 are tested in Test Auxiliary Circuit Step 1130 to identify Interconnects 1010 that are defective. If it is determined that the number of defects is greater than that which may be replaced using excess Interconnects 1010, the tested Composite Circuit 950 may be discarded or, alternatively, used to perform a reduced feature set for which the number of defects is lower than that which may be replaced using excess Interconnects 1010. The testing to identify defective Interconnects 1010 is performed as discussed above. However, the identities of defects stored to Data Storage 1020 comprise the identities of defective Interconnects 1010 rather than or in addition to the identities of defective instances of Auxiliary Circuit 920.

In a Store Results Step 1135, test results from Test Auxiliary Circuit Step 1130 are stored in a manner similar to that described for Store Results Steps 1110 and 1120, respectively.

In an optional Repair Step 1140, Auxiliary Circuit 920 is repaired by replacing defective parts of circuitry identified in Test Auxiliary Circuit Step 1130 with all or part of Excess Memory 280. In some embodiments, only parts of Excess Memory 280 determined not to be defective in Test Auxiliary Circuit Step 1130 are used to repair and replace defective parts of Auxiliary Circuit 920. In some embodiments, the number of defects within Auxiliary Circuit 920 that can be repaired in Repair Step 1140 is limited by the number of replacement circuits (or, optionally, by the number of replacements circuits determined not to include defects in Test Auxiliary Circuit Step 1130) available within Excess Memory 280.

Likewise, in Repair Step 1140, Interconnects 1010 identified in Test Auxiliary Circuit Step 1130 as being defective, can be replaced by all or part of excess Interconnects 1010. The number of defects that can be repaired is typically limited by the number of excess Interconnects 1010 available.

Repair Step 1140 includes programming (e.g., configuring) Composite Circuit 950 such that Excess Memory 280 is used as replacement for circuitry determined to include defects. Methods for programming Excess Memory 280 are described elsewhere herein. For example, programming may include configuration of Memory Controller 260, burning of fuses, or the like. In some embodiments, programming is performed using an instance of ATE 140. As in the case of Test Auxiliary Circuit Step 1130, when Interface 230 is configured in programming mode, signals are conveyed to Auxiliary Circuit 920, Excess Memory 280, and/or Data Storage 1020A via Interconnects 1010 and/or Electrical Connector 1030.

In an optional Confirm Success Step 1145, reconfigured parts of Excess Memory 280 and/or reconfigured excess Interconnects 1010 are tested in a manner similar to that described for Test Auxiliary Circuit Step 1130, to confirm that the replacement process of Repair Step 1140 was successful. In some embodiments, reconfigured Excess Memory 280, repaired parts of Auxiliary Circuit 920, and/or reconfigured excess Interconnects 1010 are tested in this step under different conditions (e.g., at a different temperature) than in Test Auxiliary Circuit Step 1130. If the test results indicate that the replacement process was not successful, the tested Composite Circuit 950 may be discarded or, alternatively, used to perform a reduced feature set.

In an optional Store Results Step 1150, the identities of any parts of Auxiliary Circuit 920, reconfigured parts of Excess Memory 280, and/or reconfigured excess Interconnects 1010 determined to include defects in Confirm Success Step 1145 are stored. Storage may occur in Data Storage 1020A and/or Data Storage 1020B. In various embodiments, storage occurs in ATE 140 in lieu of, or in addition to, Data Storage 1020. The identities stored in Store Results Step 1150 are configured to be used to replace defective parts of Auxiliary Circuit 920 and/or reconfigured Excess Memory 280 electrically connected via Interconnects 1010 not including defects using excess memory external to Composite Circuit 950.

In various embodiments, the methods described in connection with FIG. 11 are performed prior to cutting the wafer on which Auxiliary Circuit 920, Underlying Circuit 940, Excess Memory 280, and/or Data Storage 1020 are formed.

Several embodiments are specifically illustrated and/or described herein. However, it will be appreciated that modifications and variations are covered by the above teachings and within the scope of the appended claims without departing from the spirit and intended scope thereof. For example, Auxiliary Circuit 920, illustrated herein for the purpose of example as memory circuits, may be replaced by other types of circuits in alternative embodiments of the invention. Excess Memory 280 is optionally included in Underlying Circuit 940 (e.g., as Excess Memory 280B) in addition to, or in lieu of, Excess Memory 280A mounted on Underlying Circuit 940. The systems and methods described herein are equally applicable to devices including optical components. Thus, as used herein, terms such as electronic device and electronic connector may be read to include optical devices and optical interfaces (e.g., optical connectors or interconnects) configured to perform similar functions as their electronic counterparts. In some embodiments, excess circuits are used for implementation of expanded functionality of Electronic Device 120, rather than or in addition to compensation for defective circuits. In some embodiments, in which Auxiliary Circuit 920 comprises memory circuits, fuses are replaced by static memory or other non-volatile memory. As used herein, the term "micro-scale interconnects" is meant to include interconnects having widths of less than one thousand microns. These include interconnects having widths of one to one thousand microns as well as interconnects having widths of less than one micron, e.g., nano-scale interconnects.

The embodiments discussed herein are illustrative of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A system comprising:
an underlying circuit;
an auxiliary circuit mounted on the underlying circuit;
a plurality of micro-scale interconnects configured to electrically connect the underlying circuit to the auxiliary circuit;
a plurality of excess micro-scale interconnects configured for replacing micro-scale interconnects found to be defective; and
an interface within the underlying circuit and configured for testing the auxiliary circuit or the plurality of micro-scale interconnects.

2. The system of claim 1, wherein each of the plurality of micro-scale interconnects are 25 microns or less in width.

3. The system of claim 1, wherein the auxiliary circuit includes one or more memory circuits.

4. The system of claim 1, wherein the interface is further configured to receive programming instructions responsive to test data generated through the testing of the plurality of micro-scale interconnects, and configured for using the plurality of excess interconnects as replacements for defective members of the plurality of micro-scale interconnects.

5. The system of claim 1, further comprising a plurality of excess circuits configured for use as replacements for parts of the auxiliary circuit found to be defective through the testing of the auxiliary circuit.

6. The system of claim 5, wherein the plurality of excess circuits is included in the auxiliary circuit.

7. The system of claim 5, wherein the interface is configured to receive programming instructions responsive to test data generated through the testing of the auxiliary circuit, and configured to use the plurality of excess circuits to replace defective 4 parts of the auxiliary circuit.

8. The system of claim 7, wherein the programming instructions are configured to program a memory controller.

9. The system of claim 7, wherein the test data is generated prior to the mounting of the auxiliary circuit on the underlying circuit, and the programming instructions are received following the mounting of the auxiliary circuit on the underlying circuit.

10. The system of claim 7, further including an automated testing equipment/programmer configured to generate the test data.

11. The system of claim 5, wherein the auxiliary circuit includes one or more memory circuits and the plurality of excess circuits includes memory configurable for replacing defective memory cells in the memory circuits.

12. The system of claim 5, wherein the interface is further configured to convey a signal from an electrical connector to the auxiliary circuit in a test mode, and to convey another signal from the electrical connector elsewhere in a normal operation mode.

13. A method comprising:
mounting an auxiliary circuit on an underlying circuit via a plurality of micro-scale interconnects;
thereafter using an interface within the underlying circuit to generate first test results data configured to test parts of the auxiliary circuit or parts of the plurality of micro-scale interconnects; and
replacing micro-scale interconnects found to be defective with the excess micro-scale interconnects.

14. The method of claim 13, wherein the first test results data further include an identity of parts of the underlying circuit that include defects.

15. The method of claim 13, further comprising mounting a plurality of excess circuits on the underlying circuit.

16. The method of claim 15, wherein the auxiliary circuit includes one or more memory circuits and the plurality of excess circuits includes memory configurable to replace defective memory cells in the memory circuits.

17. The method of claim 15, further comprising replacing parts of the auxiliary circuit identified as including defects using one or more of the plurality of excess circuits in response to the first test results data.

18. The method of claim 15, wherein the step of mounting the auxiliary circuit is performed contemporaneously with the step of mounting a plurality of excess circuits.

19. The method of claim 13, wherein the step of mounting the auxiliary circuit includes mounting the auxiliary on the underlying circuit via a plurality of excess micro-scale interconnects.

20. The method of claim 13, wherein replacing the micro-scale interconnects with the excess micro-scale interconnects comprises using the interface within the underlying circuit.

21. An integrated circuit system comprising:
an underlying circuit;
an auxiliary circuit mounted on the underlying circuit;
a plurality of excess circuits included in the underlying circuit or the auxiliary circuit, and configured for replacing parts of the auxiliary circuit found to be defective through testing of the auxiliary circuit; and
a plurality of micro-scale interconnects configured to electrically connect the underlying circuit to the auxiliary circuit and configured for replacing micro-scale interconnects found to be defective.

22. The integrated circuit system of claim 21, wherein the plurality of excess circuits is included in the auxiliary circuit.

23. The integrated circuit of claim 21, wherein the auxiliary circuit includes one or more memory circuits and the plurality of excess circuits includes memory configurable for replacing defective memory cells in the memory circuits.

* * * * *

UNITED STATES PATENT AND TRADEMARK OFFICE
CERTIFICATE OF CORRECTION

| | |
|---|---|
| PATENT NO. | : 7,779,311 B2 |
| APPLICATION NO. | : 11/538799 |
| DATED | : August 17, 2010 |
| INVENTOR(S) | : Adrian Ong |

Page 1 of 1

It is certified that error appears in the above-identified patent and that said Letters Patent is hereby corrected as shown below:

In claim 13 (at column 24, line 21), please delete the word "the".

Signed and Sealed this

Ninth Day of November, 2010

David J. Kappos
*Director of the United States Patent and Trademark Office*